United States Patent
Nishizaka

(10) Patent No.: US 7,244,986 B2
(45) Date of Patent: Jul. 17, 2007

(54) TWO-BIT CELL SEMICONDUCTOR MEMORY DEVICE

(75) Inventor: Teiichiro Nishizaka, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 57 days.

(21) Appl. No.: 10/931,901

(22) Filed: Sep. 1, 2004

(65) Prior Publication Data

US 2005/0029578 A1    Feb. 10, 2005

Related U.S. Application Data

(63) Continuation of application No. 10/632,368, filed on Aug. 1, 2003, now Pat. No. 6,809,373.

(30) Foreign Application Priority Data

Aug. 1, 2002    (JP) .............................. 2002-225085

(51) Int. Cl.
    *H01L 29/792*    (2006.01)
(52) U.S. Cl. ................... 257/324; 257/314; 257/316; 257/909; 257/E29.302; 257/E29.309
(58) Field of Classification Search ........ 257/314–316, 257/318–322, 324, 366, E29.3–302, E29.305, 257/E29.306, E29.309
See application file for complete search history.

(56) References Cited

U.S. PATENT DOCUMENTS 5,583,810 A * 12/1996 Van Houdt et al. ..... 365/185.15
6,011,725 A     1/2000 Eitan
6,256,231 B1    7/2001 Lavi et al.
6,388,293 B1    5/2002 Ogura et al.
6,399,441 B1    6/2002 Ogura et al.
6,566,705 B1 *  5/2003 Church ....................... 257/314
6,721,205 B2 *  4/2004 Kobayashi et al. .... 365/185.26
2003/0079540 A1* 5/2003 Ogura ..................... 73/204.22

FOREIGN PATENT DOCUMENTS

| JP | 2001-156189 | 6/2001 |
| JP | 2001-230332 | 8/2001 |
| JP | 2001-512290 | 8/2001 |
| JP | 2001-357681 | 12/2001 |
| JP | 2002-26149  | 1/2002 |

* cited by examiner

*Primary Examiner*—Kenneth Parker
*Assistant Examiner*—Matthew E. Warren
(74) *Attorney, Agent, or Firm*—Scully, Scott, Murphy & Presser, P.C.

(57) ABSTRACT

A 2-bit cell is made up of first and second diffusion regions provided on a substrate surface, first and second storage nodes adjacent to the first and second diffusion region, first and second gate electrodes provided on first and second storage nodes, a third storage node provided on the substrate and a third gate electrode provided on the third storage node. The first and second gate electrodes are connected common to form word line electrodes. A control gate electrode at right angles to the word line electrodes and a third diffusion region in the substrate surface disposed at a longitudinal end of the control gate electrode are provided. A storage node, Node 1, of interest, with the control gate channel as a drain, is read without the intermediary of the second node, which is not of interest, such that reading of Node 1 unaffected by the second node.

11 Claims, 29 Drawing Sheets

ONO STRUCTURE

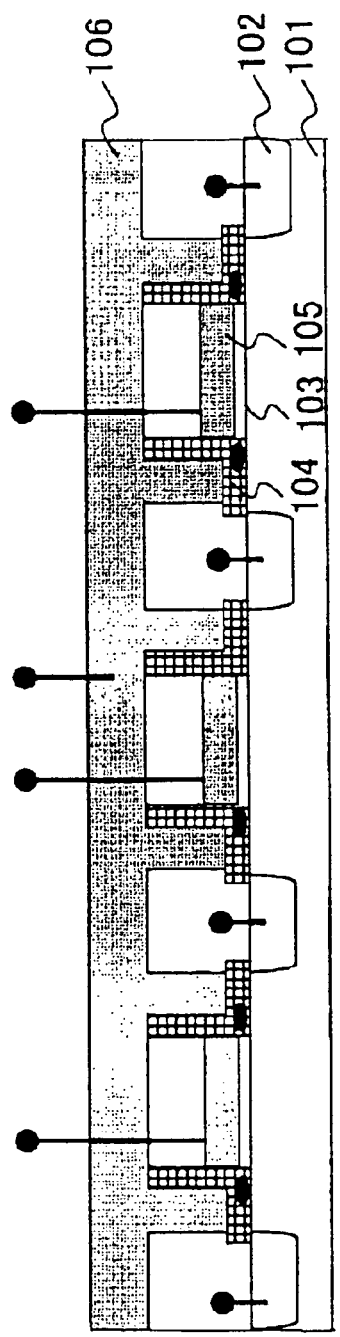
FIG. 17A | After Prog |
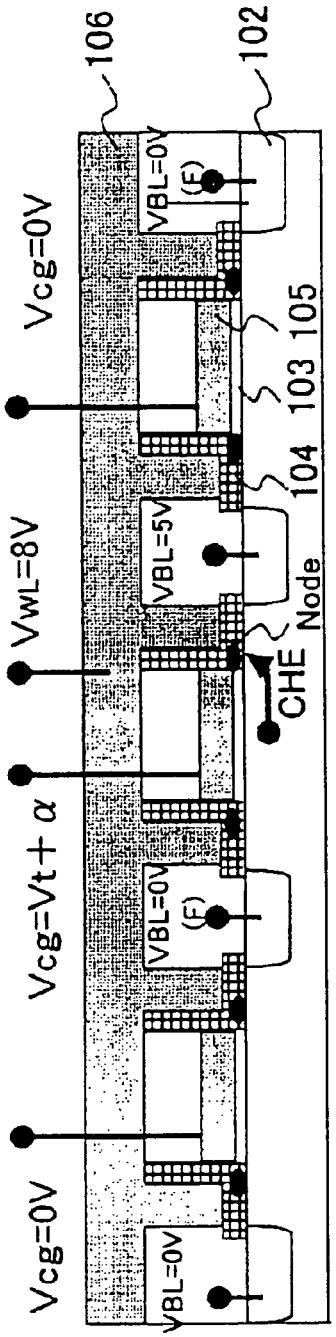
FIG. 17B | Pre Prog | Lside/Rside INDEPENDENT Program
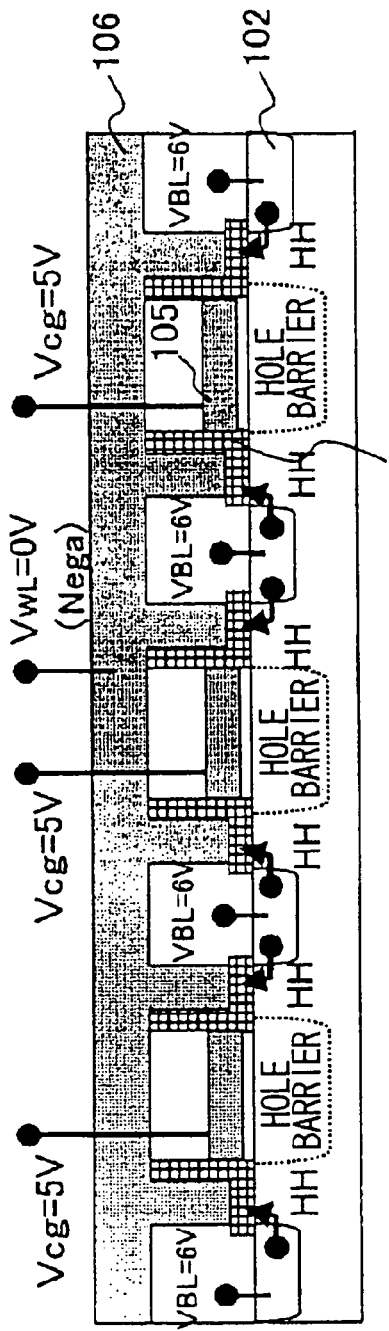
FIG. 17C | Erase | FLASH ERASE

FIG. 21A Lbit Read

FIG. 21B Rbit Read

FIG. 21C Lbit Read

FIG. 25A   PRIOR ART
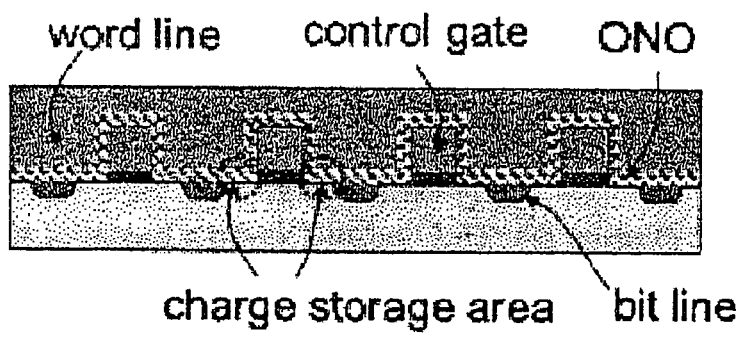
FIG. 25B   PRIOR ART
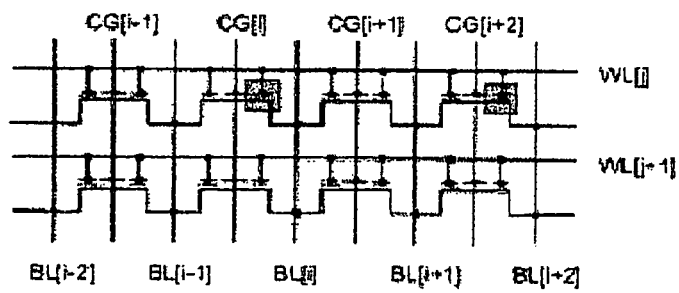
FIG. 25C   PRIOR ART
|       | Wli (j) | WL(k≠j) | BL(I+2n) | BL(I+2n-1) | CG(I+2n)  | CG(I+2n-1) |
|-------|---------|---------|----------|------------|-----------|------------|
| Prog  | 9.0V    | 0.0V    | 5.0V     | 0.0V       | 1.0V/0.0V | 0.0V       |
| Erase | 0.0V    | 0.0V    | 7.0V     | 0.0V       | 5.0V      | 0.0V       |
| Read  | Vread   | 0.0V    | 0.0V     | 1.5V       | 1.5V      | 0.0V       |

Node1:Erased
Node2:Erased

Node1:Erased
Node2:Programmed

TRAP SPACE
0.03~0.05um

Node1:Erased
Node2:Programmed

TRAP SPACE
0.2~0.25um

TWO-BIT CELL SEMICONDUCTOR MEMORY DEVICE

CROSS REFERENCE TO RELATED APPLICATION

The present application is a continuation application of Ser. No. 10/632,368 filed on Aug. 1, 2003, now U.S. Pat. No. 6,809,373 claiming priority from Japanese Patent Application No. 2002-225085 filed in Japan on Aug. 1, 2002.

FIELD OF THE INVENTION

This invention relates to a semiconductor memory device and, more particularly, to a non-volatile semiconductor memory device.

BACKGROUND OF THE INVENTION

As a conventional semiconductor memory device which has a plurality of electrically erasable and programmable read only memory cells, each being capable of storing two bits of information, there is known a cell transistor as shown schematically in FIG. 23. In a channel forming region in a substrate 11, between diffusion regions 12A and 12B in the substrate 11, there are provided an insulating film 13 and a control gate electrode 15, on both sides of which there are provided insulating films 14 and word line electrodes 16.

As for the memory cell of this sort, reference is made for example to
(1) A Novel 2-Bit/Cell MONOS Memory Device with a Wrapped-Control-Gate Structure That Applies Source-Side Hot Electron Injection, 2002 Symposium on VLSI Technology Digest of a Technical Papers, p206 to 207;
(2) Japanese Patent Kokai Publication JP-P2001-230332A (JP Patent Application 2000-269892);
(3) Japanese Patent Kokai Publication JP-P2002-26149A (JP Patent Application 2000-180763);
(4) Japanese Patent Kokai Publication JP-P2001-357681A (JP Patent Application 2000-180760);
(5) U.S. Pat. No. 6,399,441; and
(6) U.S. Pat. No. 6,388,293.

As another configuration of the memory cell, storing two bits of information per cell, such a structure shown in FIG. 24 has been proposed. In the undermentioned publication (10) (Japanese Patent Kohyo Publication JP-P2001-512290A), for example, it is stated that a non-volatile memory of the MONOS (metal-ONO-silicon) structure, including, as a gate insulating film 14, which comprises a silicon oxide film formed on a substrate, a silicone nitride film formed on the silicon oxide film and a silicon oxide film formed on the silicone nitride film, referred to as an oxide nitride oxide (ONO) film, is able to store 2-bit data per cell in a charge trapping film (silicon nitride film) sandwiched between silicon oxide films directly below the gate electrode. In an EEPROM (Electrically Erasable and Programmable Read Only Memory), having a charge trapping film and 2-bit storage node per cell, two separate bits, that is a left side node Node1, and a right side node Node2, are formed in spatially spaced apart regions in the charge trapping film. The two bits (storage nodes) are read in the opposite direction to the direction in which the bits were programmed. For example, the Node2 is programmed in the charge trapping film in the ONO film 14 by applying a positive write voltage across the gate electrode 16 and the drain diffusion region 12B, as the source diffusion region 12A is grounded, for injecting sufficiently accelerated hot electrons into a region adjacent to the drain diffusion region 12B of the charge trapping film in the ONO film 14. The stored bits are read in the opposite direction to the direction in which the bits were written, that is by applying the positive electrode to the source electrode 16 and the source diffusion region 12B, as the drain diffusion region 12B is grounded. The memory cell is erased by applying a suitable erase voltage to for example the gate electrode 16. For erasing the Node2, the erase voltage is applied to the drain diffusion region 12B and, for erasing the Node1, the erase voltage is applied to the drain diffusion region 12A for expelling the electrons from the charge trapping film. Thus, by applying preset gate, drain and the source voltages, two bits can be independently stored in the left and right regions of the charge trapping film directly below the gate electrode.

This sort of the memory cell has been disclosed in for example the
(7) U.S. Pat. No. 6,011,725;
(8) U.S. Pat. No. 6,256,231;
(9) Japanese Patent Kokai Publication JP-P2001-156189A (JP Patent Application 2000-306999); and
(10) Japanese Patent Kohyo Publication JP-P2001-512290A (JP Patent Application 2000-505640).

The 2-bit cell MONOS memory device, described in the above Publication (1), is now explained in detail.

In the above Publication (1), there are shown a cross-sectional view and an equivalent circuit of the MONOS memory of the one-cell two-bit configuration, shown in FIGS. 25A to 25C, as well as the bias conditions for the write, erase and read operations.

The memory cell includes paired impurity diffusion regions (paired bit lines), provided in the substrate surface, plural control gates CG provided on the silicon oxide film between the neighboring diffusion regions in the substrate surface, and plural word lines WL extending in a direction perpendicular to the control gates on the ONO film on both sides of the silicon oxide film in the substrate surface, to carry out programming and erasure for the nodes by source side hot electron injection and by hot hole electron injection, respectively.

In the Publication (1), the respective storage sites below the word line WL[j] on the right hand side of the control gate CG [1+2n] are programmed in parallel. The bit line BL [l+2n−1] is set to the ground potential, the bit line BL [I+2n] is biased to 5.0V, while the word line WL[j] is biased to 9.0V. The control gate CG[I+2n] is biased to 1.0V/0.0V to induce/suppress the source side hot electron injection. The information stored on the right hand side of the control gate is erased by hot hole injection produced by the bias conditions of FIG. 25C. During read, the bit line BL[I+2n−1] is biased to 1.5V, while the bit line BL [i+2n] is biased to 0.0V, the word line WL[j] is biased to Vread and the control gate CG [I+2n] is biased to 1.5V. For programming/erasing the storage site for the left hand side of the control gate CG [I+2n], the bias conditions for the bit line BL [I+2n−1], BL [I+2n] are exchanged. The respective bits of the memory cells are read by applying the reverse read, as indicated in FIG. 25C.

SUMMARY OF THE DISCLOSURE

Referring to FIG. 26, the operation of programming in the memory cell, as disclosed in the above Publication (1), is scrutinized. The following shows the results of analyses which are based on the results of the investigations by the present inventor.

FIG. 26A is a diagram showing the structure of a memory cell disclosed in the Publication (1). FIG. 26A is drawn by the present inventor for explaining the operation of memory cell disclosed in the Publication (1). In FIG. 26A, 201 denotes a semiconductor substrate, 202 denotes a N+ diffusion region, also simply referred to as a diffusion region, 203 denotes a gate insulating film, 204 denotes an ONO film, 205 denotes a control gate (electrode) and 206 denotes a word line (electrode). In writing (programming) in the node 1 (Node1), the voltages of 5V and 0V are applied to the bit lines BL1 and BL2, respectively. The voltage of 9V is applied to the word line 206 (VWL=9V). At this time, the voltage of 1V is applied to the control gate 205 (VCG=1.0V) to suppress the current flowing into the channel to a lower magnitude. FIG. 26B shows an electric field in a channel region in FIG. 26A. FIG. 26B shows a result based on the investigation by the present inventor.

In view of the increased channel resistance, an electric field is concentrated, as shown in FIG. 26B, to inject the electrons into the ONO film 204. The maximum strength point of the electric field occurs on a boundary between the word line 206 and the control gate 205. It is at this location of the electric field concentration that the electrons migrated from the source diffusion region (BL2) are accelerated in the vicinity of the maximum strength of the electric field to exhibit a high energy. The accelerated electrons are sucked by the positive electric field of the word line 206 so as to be trapped in a portion of the ONO film 204 slightly offset towards the drain diffusion region (BL1) from the boundary between the word line 206 and the control gate 205. Meanwhile, writing in the opposite side storage node may be achieved by interchanging the bias voltages applied to the source and the drain.

The site of electron trap in the ONO film 204 (indicated by a black circle specified by the Node1 in FIG. 26A) is near the boundary between the electrode of the word line 206 and the electrode of the control gate 205 and is at a preset distance from the drain diffusion region 202 (BL1).

As described above, the source side injection phenomenon is exploited in the programming operation.

Referring to FIG. 27, the read operation of the memory cell, disclosed in the Publication (1), is scrutinized. FIG. 27 is a diagram drawn by the present inventor for describing the problem which the present inventor has found in the read operation of the memory cell disclosed in the Publication (1).

In the following explanation, it is assumed that no electrons are trapped in the first node (Node1), and that electrons are trapped in the second node (Node2).

When reading the first node (Node1), the voltages of 1.5V and 0V are applied to the bit lines BL2 and BL1, respectively. That is, read is carried out with the diffusion region 202 of the node to be read as the source. Since no electrons are trapped in the first node (Node1), the read current should flow through the memory cell. However, the electrons trapped by the second node (Node2) affect the potential on the channel surface to render the channel current flow difficult.

In order to avoid this problem, a higher voltage must be applied to the bit line BL2 to extend a depletion layer 207 to render the effect of the electrons trapped in the second node (Node2) less apparent.

On the other hand, the distance between the electron trapping region, located near the boundary between the word line electrode 206 and the control gate electrode 205, and the bit line diffusion region, referred to below as "trap space" (see FIG. 27), is susceptible to process variations.

If, for example, the trap space is large, a high voltage needs to be applied to the BL diffusion region 202. If, for example, the trap space is on the order of 0.1 μm, the voltage applied needs to be 2 to 3V.

If, due to process variations, the distance of the trap space is varied, the channel current is varied to render it difficult to realize stable circuit operation.

The relationship between the trap space and the channel current is now explained based on the results of analyses by the present inventor.

FIG. 28A shows voltage to current (V-I) characteristics of the memory cell transistor when no electrons have been trapped in the first node (Node1) nor in the second node (Node2). The characteristics shown are those of the usual transistor. Meanwhile, the voltage to current (V-I) characteristics of FIG. 28 show measured values of a device tentatively produced by the present inventor.

On the other hand, FIG. 28B shows characteristics of the channel current (indicated on the ordinate) when electrons are trapped in only the second node (Node2) and when the drain voltage (indicated on the abscissa) is applied to the second node (Node2). The same voltage Vg is applied to the control gate and to the word lines.

The trap space of this memory cell is estimated to be approximately 0.03 to 0.05 μm. Thus, if the trap space is that small, a sufficient current can be caused to flow even with the drain voltage on the order of 1.5V.

However, if the pseudo state of the elongated trap space is produced, as shown in FIG. 28C, it becomes difficult to provide the channel current of the memory cell. That is, if the pseudo state equivalent to the state of the voltage Vg of 4V of the word line and the control gate is created, only small channel current flows for the drain voltage of 1.5V, while no current flows for Vg=3V.

Thus, it may be seen that the memory cell current depends appreciably on the length of the trap space and is susceptible strongly to process variations.

Referring to FIG. 29, the operation of erasing the memory cell as stated in the Publication (1) (Erase operation) is explained. The erasure operation exploits the hot hole injection phenomenon of erasing the memory cell and may be achieved by recombining the electrons trapped in the electron trap area with holes.

If, when the electrons trapped in the first node (Node1) are to be recombined, a high voltage of, for example, VBN=7.0V, is applied to the terminal of the bit diffusion region (BL1), hot holes are generated at a junction between the N-type diffusion region 202 and the P-type silicon substrate 201 due to the band-to-band tunneling phenomenon. These holes (positive holes) are attracted by the potential of the word line 206 and injected into the ONO film 204.

The holes are diffused towards the second node (Node2) as opposing the potential of the N-type diffusion region 202 of the BL1 terminal. However, only a fraction of the holes are attracted by the potential of the word line 206 so as to be injected into the ONO film 204.

Moreover, if the trap space is too long, the generated holes are diffused and spread through the silicon substrate 201, so that the phenomenon of recombination is less susceptible to be produced.

The problems of the conventional semiconductor memory device, described in the above Publication (1), may be summarized as follows:

During read, the memory cell current depends on the trap space length, which is susceptible to process variations, so that no stable characteristics may be achieved.

The erasure characteristics depend on the trap space length such that the erasure characteristics are unstable.

There lacks up to now a technique of providing and realizing the trap space length which is less susceptible to process variations.

Accordingly, it is an object of the present invention to provide a semiconductor memory device in which channel current variations ascribable to e.g. size variations due to process variations may be reduced to assure a stable circuit operation.

It is another object of the present invention to provide a method for manufacturing and a method for controlling the semiconductor memory device.

The above and other objects are attained by a semiconductor memory device in accordance with one aspect of the present invention which includes a first diffusion region provided in a substrate surface, a first insulating film provided in a first area on the substrate neighboring to the first diffusion region, a first gate electrode formed on and laying the first insulating film, a second insulating film provided in a second area on the substrate neighboring to the first area, and a second gate electrode formed on and overlaying the second insulating film, constitute a unit cell. A second diffusion region is provided in a third area in the substrate surface located in an extension of the second electrode. In the unit cell, the first gate electrode intersects the second gate electrode via an insulating film. The unit cell stores one bit.

A two-bit cell transistor in accordance with another aspect of the present invention comprises unit cells arranged symmetrically to each other and includes first and second diffusion regions, provided in separation from each other in a substrate surface, first and second insulating films provided in first and second areas on the substrate neighboring to the first and second diffusion regions, respectively, first and second gate electrodes, provided on the first and second insulating films, a third insulating film provided in a third area on the substrate neighboring to the first and second areas, a third gate electrode provided on the third insulating film and a fourth insulating film provided on the third gate electrode, with the first and second diffusion regions, first and second insulating films, first and second gate electrodes, third insulating film, third gate electrode and the fourth insulating film constituting a cell for storage of the two-bit information therein. The first and second gate electrodes are connected common on the fourth insulating film to make up a word line electrode. The third gate electrode constitutes a control gate electrode extending in a direction perpendicular to the word line. A third diffusion area is provided in a fourth area in the substrate surface located on an extension of the third gate electrode.

As a layout structure of the unit cell in accordance with the present invention, a buried diffusion region is provided in the substrate surface, at one or both longitudinal ends of a control gate electrode arranged on the substrate with interposition of a first insulating layer, in an area neighboring to a first diffusion region in the substrate surface, and a first gate electrode is provided in an area between the control gate and the first diffusion region with interposition of a second insulating film including a charge trapping film. The first gate electrode is connected to a word line electrode arranged at right angles to the control gate electrode. The first diffusion region, the first gate, the control gate and the buried diffusion region form a unit cell.

As a layout structure of the unit cell, in accordance with the present invention, there are provided first and second diffusion regions arranged as two rows in a substrate surface in separation from each other, a control gate electrode arranged in an area on the substrate between the first and second layers, forming the rows, with interposition of a first insulating film, and a buried diffusion region in an area in the substrate surface at one or both longitudinal ends of the control gate electrode. There are also provided first and second gate electrodes provided in a first area between the first diffusion region and the control gate and in a second area between the second diffusion region and the control gate, respectively, with interposition of second and third insulating films, each including a charge trapping film, respectively. The first and second gate electrodes are connected to a word line electrode arranged at right angles to the control gate electrode. The first diffusion region, first gate, control gate and the buried diffusion region form a first unit cell, while the second diffusion region, second gate, control gate and the buried diffusion region form a second unit cell.

A semiconductor memory device in accordance with another aspect of the present invention comprises a plurality of rows of diffusion regions extending in a memory cell area in a substrate surface parallel to one another along one direction in separation from one another, with the plural rows of diffusion regions being connected to associated bit lines, a buried diffusion region extending in the substrate surface in a direction perpendicular to the one direction at a location spaced apart from both longitudinal ends of the plural rows of diffusion regions, a plurality of word line electrodes arranged on the substrate with interposition of a first insulating film including a charge trapping film, with the word line electrodes extending parallel to one another in a direction perpendicular to the one direction, and a plurality of control gate electrodes arranged on the substrate in adjacency to an associated one of the diffusion regions, with interposition of an insulating film, for extending along the one direction, with the control gate electrode three-dimensionally intersecting the buried diffusion region with interposition of the second insulating film.

In a semiconductor memory device, according to one aspect of the present invention, in programming of the cell, the selected word line electrode is set to a first positive voltage, a second voltage equal to a threshold voltage (Vt) or higher by a preset voltage than the threshold voltage is applied to a control gate electrode of a selected cell, a ground potential is applied to the buried diffusion region, and a third positive voltage is applied to a bit line connecting to a diffusion region closer to a storage node as a program target in the cell, so that the buried diffusion region operates as an electron supply source to effect programming by source side injection to the storage node.

According to the present invention, in cell erasure operation, the word line electrode is set to a ground potential or a negative voltage, a fifth positive voltage is applied to a bit line connecting to the diffusion region, a sixth voltage is applied to the control gate electrode and a fourth voltage is applied to the buried diffusion region to form a hole barrier in a channel directly below the control gate electrode to effect cell erasure. The fifth positive voltage is applied to all bit lines of the memory cell area, the totality of the word line electrodes in the memory cell area are at a ground potential or at a negative voltage, and the sixth positive voltage is applied to the totality of the control gate electrodes of the memory cell area to effect collective (flash) erasure of a plurality of cells in the memory cell area.

According to the present invention, in cell read operation, a seventh positive voltage is applied to the buried diffusion region, an eighth positive voltage is applied to the control gate of a cell to be read, a ground potential is applied to a bit line connected to the diffusion region closer to the storage node to be read in the cell, and a ninth positive voltage is applied to the selected word line electrode to read the cell with the buried diffusion region as the drain side. Alternatively, a ground potential is applied to the buried diffusion region, an eighth voltage is applied to the control gate of a cell to be read, a seventh positive voltage is applied to the bit line connecting to the diffusion region closer to the storage node to be read in the cell, and a ninth positive voltage is applied to the selected word line electrode to read the cell with the buried diffusion region as the source side.

A method for manufacturing a semiconductor memory device in yet another aspect of the present invention comprises the steps of:

depositing a first insulating film and a first electrically conductive film in this order on a semiconductor substrate;

depositing a second insulating film on the first electrically conductive film;

patterning a laminated film composed of the first insulating film, first electrically conductive film and the second insulating film to form a control gate;

depositing a third insulating film on the entire surface of the substrate;

depositing a second electrically conductive film on the entire surface of the substrate and subsequently processing the second electrically conductive film in the form of a sidewall on a sidewall section of the control gate covered by the third insulating film;

performing ion injecting with the control gate and with the sidewall of the second electrically conductive film as a mask to form a diffusion region in the substrate surface by self-alignment;

forming a fourth insulating film on the entire substrate surface and subsequently exposing an upper portion of the sidewall of the second electrically conductive film by polishing or etchback; and depositing a third electrically conductive film on the entire substrate surface and subsequently removing the third electrically conductive film and the sidewall of the second electrically conductive film to form a word line.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 17A to 17C illustrate the erase operation for a new file memory in a cross-section along line A-A' of FIG. 14, with FIGS. 17A showing the state after programming, FIG. 17B showing the state of pre-programming and FIG. 17C showing the flash erase operation

FIGS. 25A to 25C show a conventional technique shown in a Publication (1), with FIG. 25A showing a cross-section, FIG. 25B depicting an equivalent circuit and FIG. 25C showing a list of bias conditions for the program, erase and read.

PREFERRED EMBODIMENTS OF THE INVENTION

Figure 22:
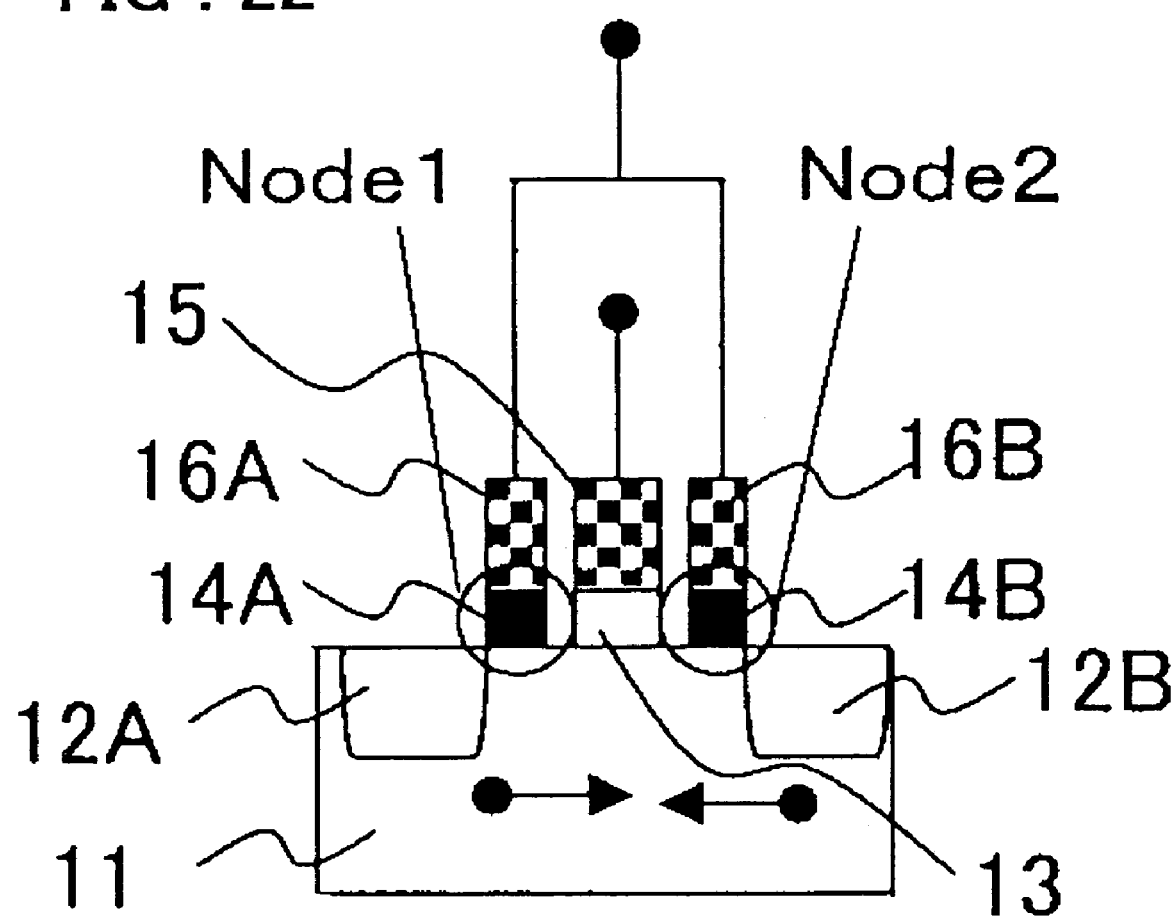
FIG. 22 illustrates the principle of the present invention.
Figure 23:
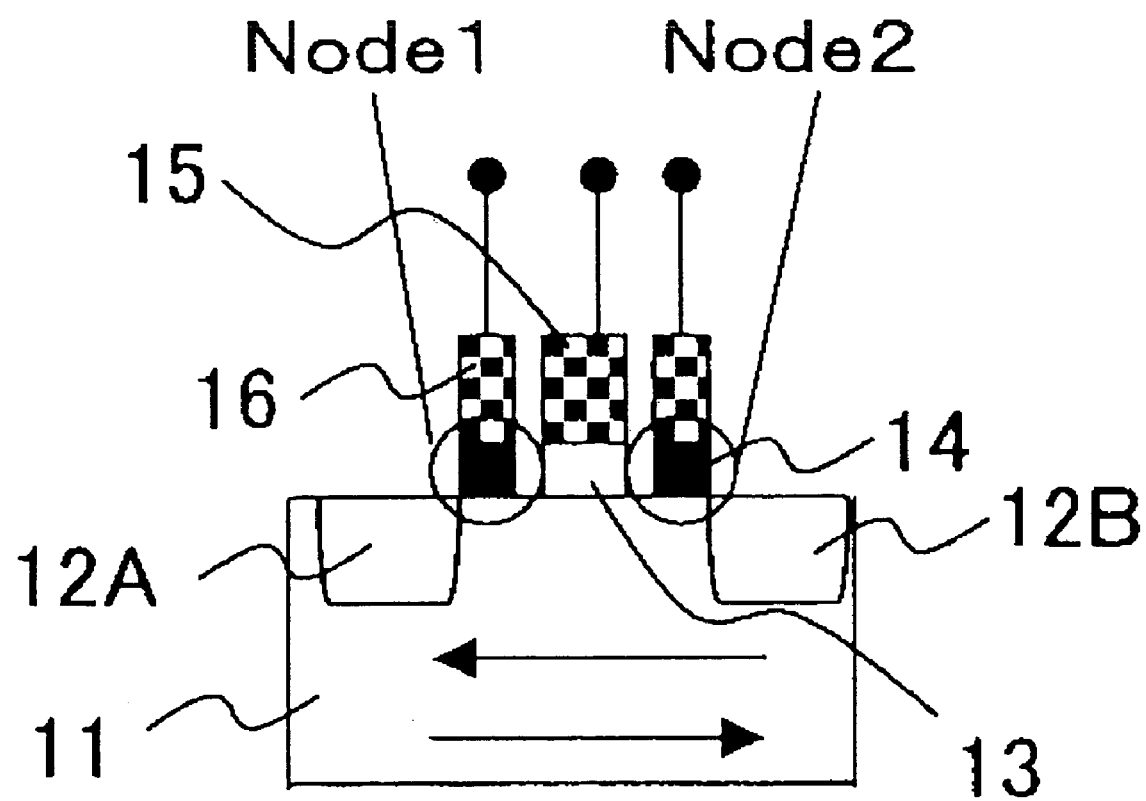
FIG. 23 illustrates a conventional memory for storage of two bits per cell.
Figure 24:
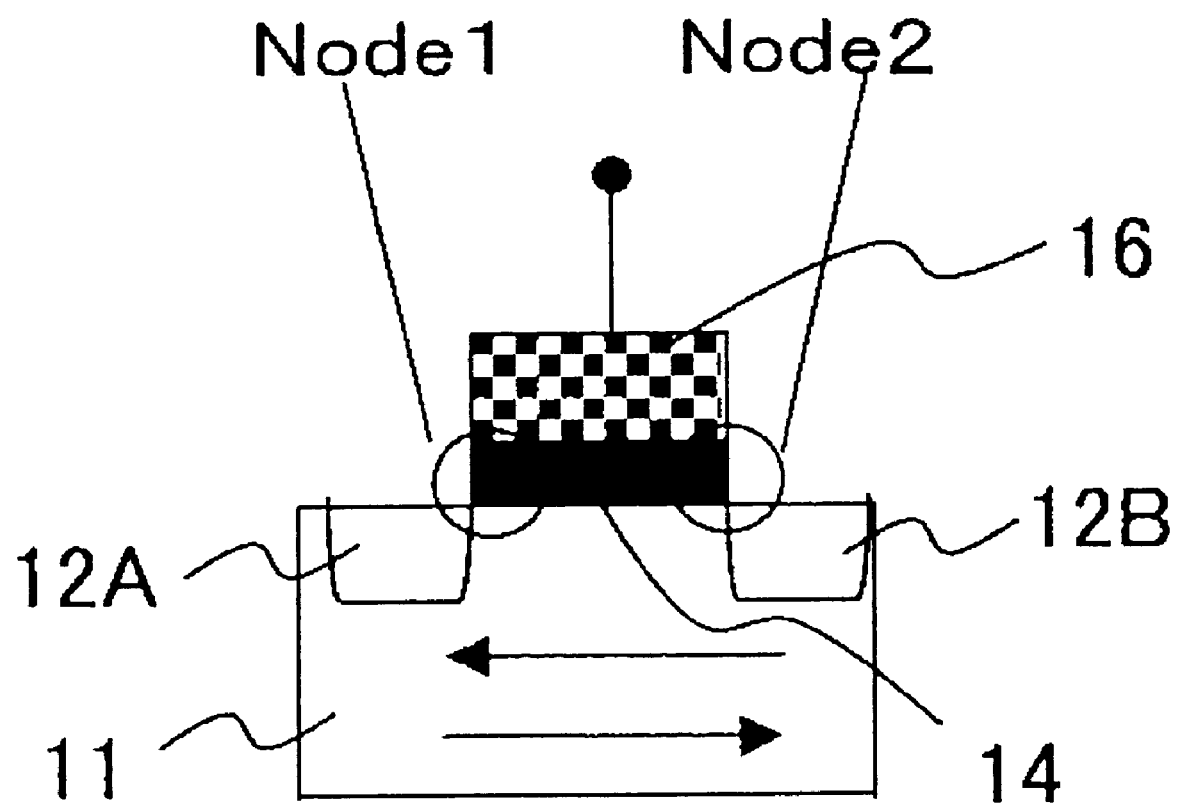
FIG. 24 illustrates another conventional memory for storage of two bits per cell.
Figure 26A:
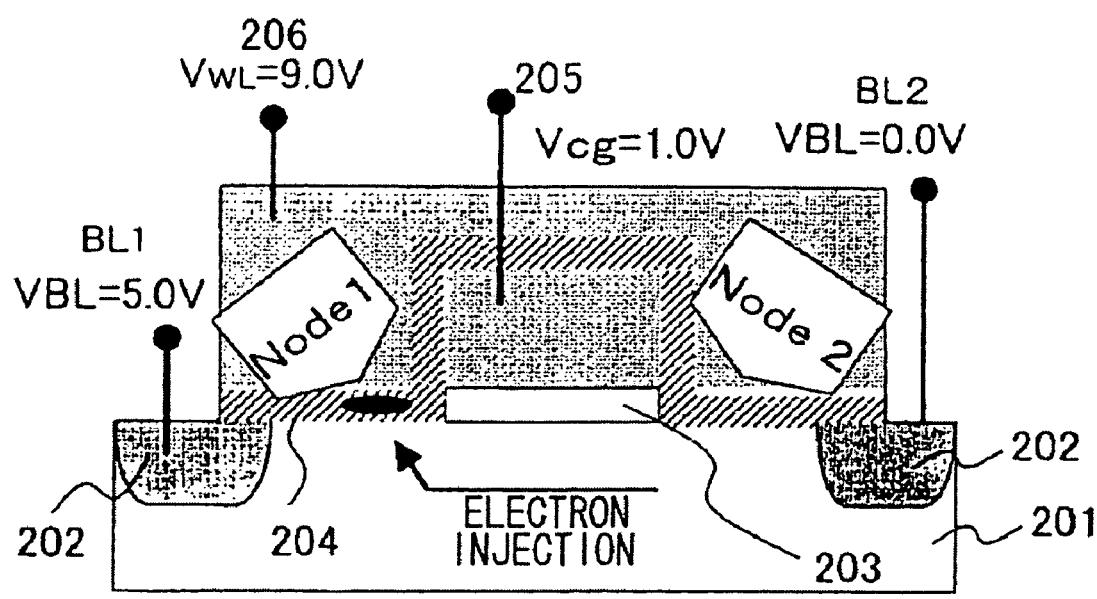
FIGS. 26A and 26B illustrate the problem inherent in the related art, with FIG. 26A showing a cross-section and FIG. 26B showing an electric field in the horizontal direction.
Figure 26B:
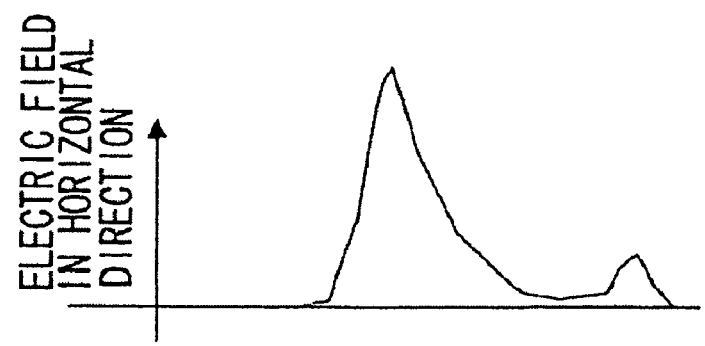
Figure 27:
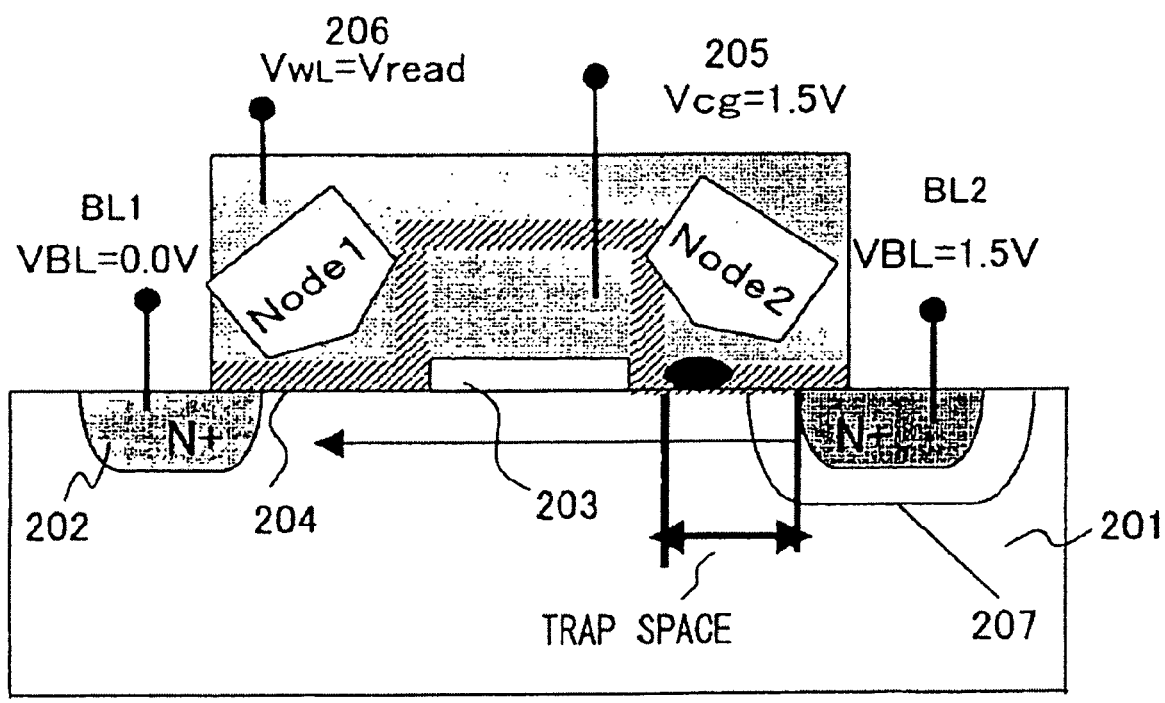
FIG. 27 illustrates a problem inherent in the related art.
Figure 28A:
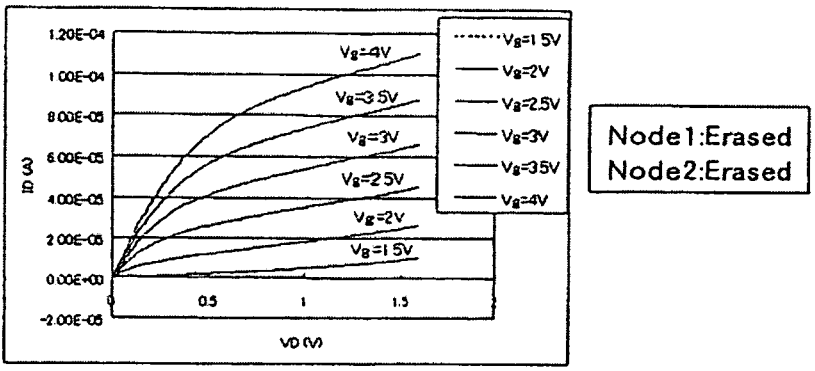
FIGS. 28A to 28C show the relationship between measured values of the trap space and the channel current.
Figure 28B:
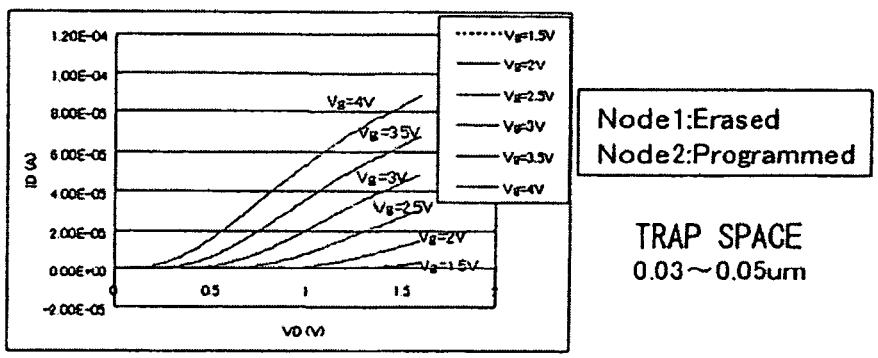
Figure 28C:
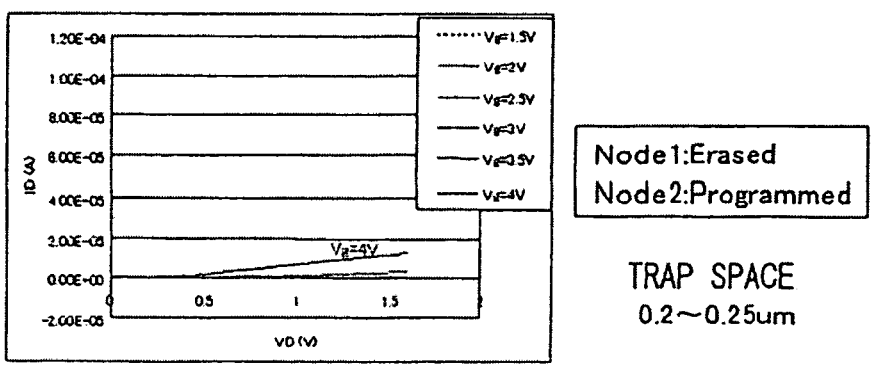
Figure 29:
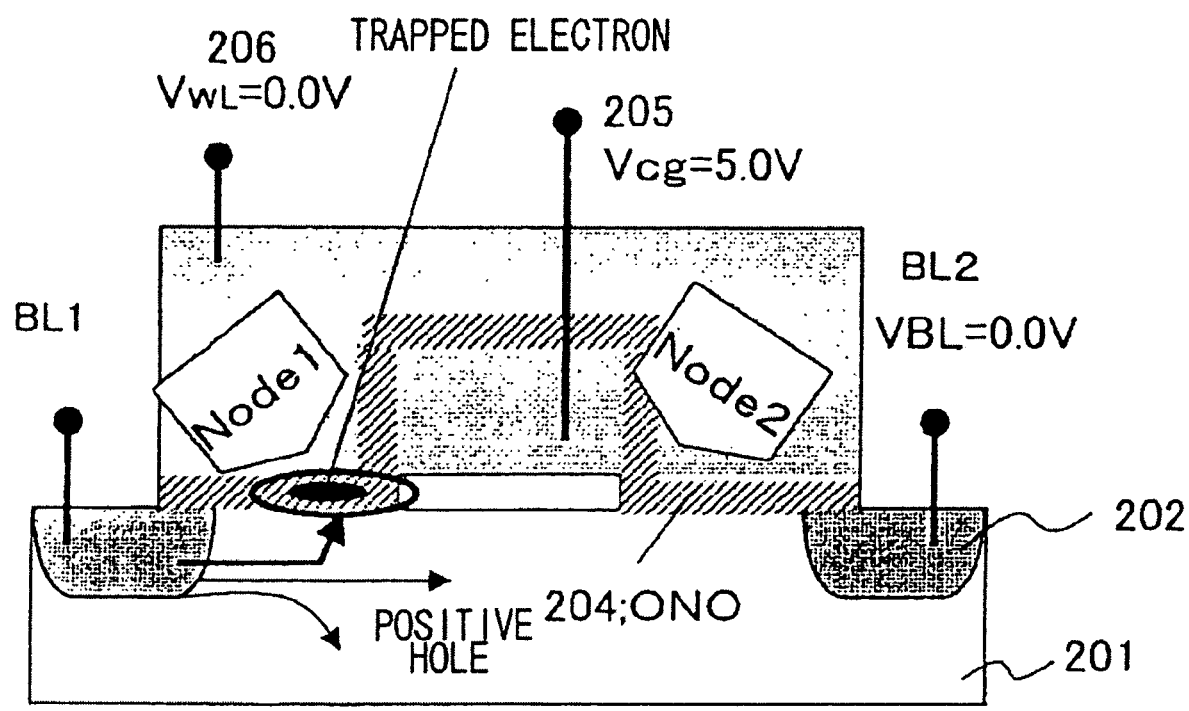
FIG. 29 illustrates another problem inherent in the related art.

Preferred embodiments of the invention will be described in the below. FIG. 22 schematically shows the structure of a memory cell transistor of the present invention. Referring to FIG. 22, the structure and the operating principle of the present invention is described. Each unit cell is made up by a first diffusion region 12A, provided in a substrate 11, a first insulating film 14A, provided in a first area on the substrate adjacent to the first diffusion region 12A, a first gate electrode 16A formed on and overlaying the first insulating film 14A, a second insulating film 13, provided in a second area on the substrate neighboring to the first area, and a second gate electrode 15, formed on and overlaying the second insulating film 13. A second diffusion region is provided in a third area, not shown, of the substrate surface located at a longitudinal end of the second gate electrode 15. The first gate electrode 16A is arranged at right angle to the second gate electrode 15.

In the present embodiment of the present invention, a unit cell is arranged line-symmetrically with respect to another unit cell.

Referring to FIG. 22, a two-bit cell is made up by first and second diffusion regions 12A and 12B, provided at a spacing from each other in the substrate surface, a first insulating layer 14A, provided in a first area on the substrate neighboring to the first diffusion region 12A, a first gate electrode 16A, formed on and overlaying the first insulating film 14A, a second insulating film 13, provided in a second area on the substrate neighboring to the first area, a second gate electrode 15 formed on and overlaying the second insulating film 13, a third insulating film 14B, provided in the third area on the substrate neighboring to the second diffusion region 12B, and a third gate electrode 16B, formed on and overlaying the third insulating film 14B. The first and third gate electrode 16A and 16B are connected common to form a word line electrode, while the second gate electrode forms a control gate electrode extending in a direction perpendicular to the word line electrode. A third diffusion region, not shown, is provided in a fourth area in the substrate surface located at a longitudinal end of the control gate electrode.

In programming a cell, in accordance with the present invention, the selected word line electrode is set to a voltage (VWL=8V), a second voltage (Vt+α) higher by a preset voltage than a threshold voltage value (Vt) is applied to the control gate electrode of the selected cell, a zero voltage is applied to the buried diffusion region and a third positive voltage (VBL=5V) is applied to the bit line connecting to the diffusion region lying closer to the storage node of the cell being written, to effect programming in the storage node by source side injection, with the buried diffusion region operating as an electron supplying source.

In erasing a cell, in accordance with the present invention, a fourth voltage (VSBL=3V) is applied to the buried diffusion region, and the selected word line electrode is set to 0V or a negative voltage (VWL=0V), a fifth positive voltage (VBL=5V) is applied to the bit line connecting to the diffusion region, and a sixth positive voltage (Vcg=5V) is applied to the control gate electrode (Vcg=5V), to erase the cell of the memory cell area.

In reading the cell, in accordance with the present invention, a seventh voltage (VSBL=1 to 2V) is applied to the buried diffusion region and an eighth positive voltage (Vcg=3V) is applied to the control gate of the cell being read, while 0V is applied to the bit line connecting to the diffusion region closer to the storage node of the cell being read (VBL=0V) and a ninth positive voltage is applied to the selected word line electrode (VWL=3V) to read the cell with the buried diffusion region as a drain side.

In reading the cell, in accordance with the present invention, a zero voltage is applied to the buried diffusion region and an eighth positive voltage (Vcg=3V) is applied to the control gate of the cell being read, while a seventh voltage (VBL=1 to 2V) is applied to the bit line connecting to the diffusion region closer to the storage node of the cell being read and a ninth positive voltage is applied to the selected word line electrode (VWL=3V) to read the cell with the buried diffusion region as a source side.

In programming in the Node1 in the memory cell transistor of the present invention, source side injection is carried out, with the control gate channel as a source, to write in the Node1 as a target storage node, without the intermediary of the non-target storage node Node2, thereby achieving stable write characteristics.

In reading the storage node in the memory cell transistor of the present invention, the read may be performed, with the control gate channel as the drain, to effect read of the target storage node without the intermediary of the non-target storage node.

Thus, the memory cell transistor of the present invention can be operated substantially as a one-bit cell, thus providing for the stable memory cell current.

Moreover, with the memory cell transistor of the present invention, a positive potential is applied to the channel of the control gate to prevent hole diffusion to permit the hole injection into the electron trapping region to achieve efficient erasure.

A manufacturing method according to an embodiment of the present invention includes the following steps of:

forming a first insulating layer (103) on a semiconductor substrate (101) and forming a first electrically conductive film (105) thereon;

forming a second insulating film (107) on the first electrically conductive film (105);

patterning the first insulating film (103), first electrically conductive film (105) and the second insulating film (107) to form a control gate;

forming a third insulating film (104), including a film operating as a charge trapping film for the cell transistor, on the entire substrate surface;

forming a second electrically conductive film (106A) on the entire substrate surface and subsequently processing the second electrically conductive film (106A) in the form of a sidewall at a sidewall section of the control gate which are covered by the third insulating film;

injecting ions with the control gate electrode (105) and with the sidewall of the second electrically conductive film (106A) as a mask to form a diffusion region (102) in the substrate surface by self-alignment;

forming a fourth insulating film (107A) on the entire substrate surface and subsequently exposing an upper portion of the sidewall of the second electrically conductive film (106A) and the second insulating film (107) on the control gate electrode (105) by polishing or etchback, depositing a third electrically conductive film (106) and subsequently removing the third electrically conductive film and the sidewall of the second electrically conductive film to form a word line.

With the present embodiment of the manufacturing method of the present invention, in which the diffusion region is formed by self-alignment, with the control gate electrode and the sidewall of the word line electrode as the mask, the distance between the electron capture film (storage node) lying in the vicinity of the boundary between the word line electrode and the control gate electrode and the diffusion region (trap space) is less susceptible to process variations, with the consequence that device characteristics may be improved in stability.

Figure 1:
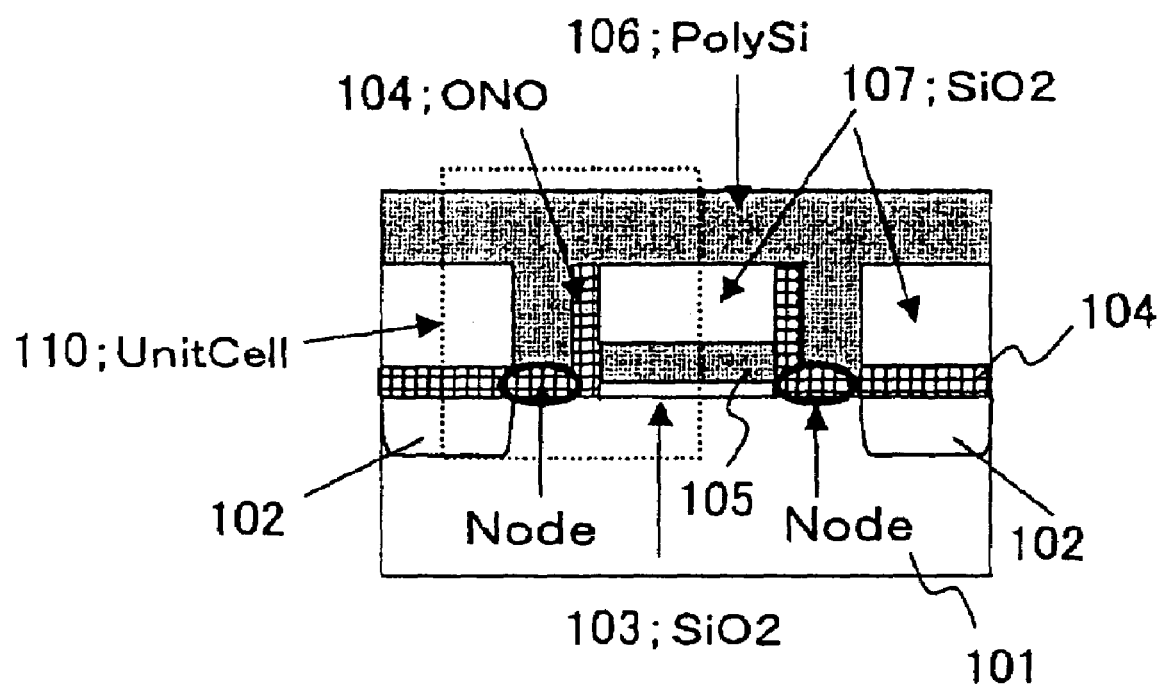
FIG. 1 schematically shows the cross-sectional structure of a first embodiment of the memory cell transistor according to the present invention.

For illustrating the above-described embodiments of the present invention in further detail, reference is now made to the drawings, in which FIG. 1 schematically shows the cross-section of a memory cell transistor according to a first embodiment of the present invention. Referring to FIG. 1, a plural number of pairs of N+ diffusion regions 102 provided in a substrate 101 (referred to simply as diffusion regions 102) are provided for extending in the bulk of the substrate 101 in the vertical direction to form bit lines (also termed bit diffusion regions). The memory cell transistor also includes a silicon oxide layer 103, provided on the substrate between the N+ diffusion regions 102, and a control gate electrode 105, provided on and overlaying the silicon oxide layer 103. A silicon oxide film 107 is provided on and overlaying the control gate electrode 105.

On the sidewall sections on both sides of the control gate, made up of the laminated structure of silicon oxide layer 103, control gate electrode 105 and the silicon oxide film 107, there are provided sidewall sections of an ONO film 104, made up by a silicon oxide film, a silicon nitride film and a silicon oxide film. The bottom surface of the ONO film 104, having the sidewall sections, abuts against the surface of the substrate 101. The ONO film 104 is extended on the surface of the substrate 101 towards the N+ diffusion regions 102 to overlie the N+ diffusion regions 102.

A word line electrode 106 is extended in a direction perpendicular to the longitudinal direction of the control gate electrode 105 for three-dimensionally intersecting the control gate electrode 105. That is, in an intersecting region with respect to the control gate electrode 105, the word line electrode 106 abuts against the silicon oxide film 107 provided on the control gate electrode 105. The word line electrode 106 is provided with π-shaped legs protruded towards the substrate along the ONO film 104 on both sides of the control gate. The lateral surfaces of the two legs of the word line electrode 106 abut against the ONO films 104 on both sides of the control gate, with the bottom surfaces of the legs abutting against the surface of the ONO film 104 provided on the substrate 101 in adjacency to the diffusion regions 102. The lateral sides of the control gate electrode 105 and the legs of the word line electrode 106 are electrically insulated from each other by the intermediary of the ONO film 104.

An insulating film, comprised of the silicon oxide film 107, is provided between the ONO film 104 overlying the diffusion regions 102 and the upper side word line electrode 106.

A unit cell 110 is made up by one diffusion region 102, the word line electrode 106 provided on the ONO film 104 neighboring to the diffusion region 102, and by the control gate electrode 105 provided on the gate insulating film 103. In FIG. 1, an electron trapping region is indicated by Node and is located within the ONO film 104 in the vicinity of the boundary between the word line electrode 106 and the control gate electrode 105.

This Node is programmed by injecting hot electrons into the node (Node) by the source side injection, using the diffusion region located at an end of the control gate electrode 105 in the vertical direction of the drawing as a source, that is, as an electron supply source.

That is, two unit cells are shown in FIG. 1 and, when one of the unit cells is programmed, there is no risk of the other unit cell being programmed, because no channel current flows through the channel region between the two diffusion regions.

The word line electrode 106 is formed of, for example, polycrystalline silicon. Of course, the word line electrode may be formed by a high melting metal silicide provided on a polycrystalline silicon surface.

Figure 2:
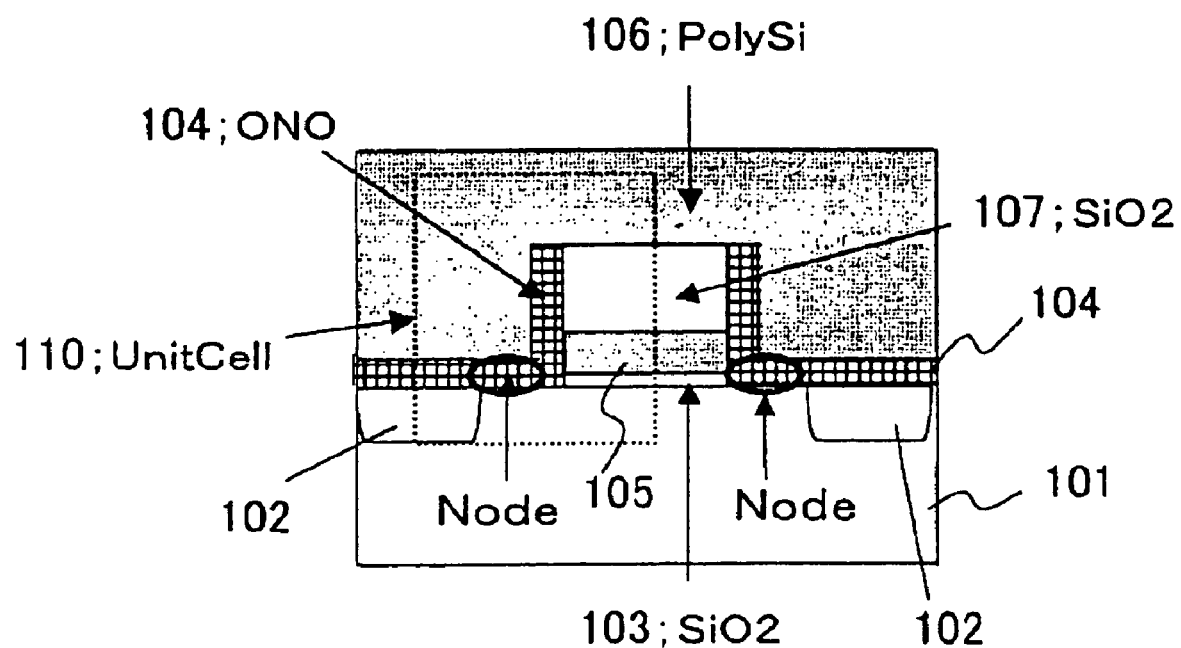
FIG. 2 schematically shows the cross-sectional structure of a second embodiment of the memory cell transistor according to the present invention.

FIG. 2 schematically shows the cross-section of a memory cell transistor of a second embodiment of the present invention. Referring to FIG. 2, the word line electrode 106 is provided on the diffusion region 102 with the intermediary of the ONO film 104. In the first embodiment, shown in FIG. 1, the silicon oxide film 107 is provided on the ONO film 104, provided in turn on the diffusion region 102, with the surface of the silicon oxide film 107 abutting on the word line electrode 106. The present embodiment differs from the first embodiment as to the bottom surfaces of the legs of the word line electrode 106 abutting against the surface of the ONO film 104 on the diffusion region 102.

Figure 3A:
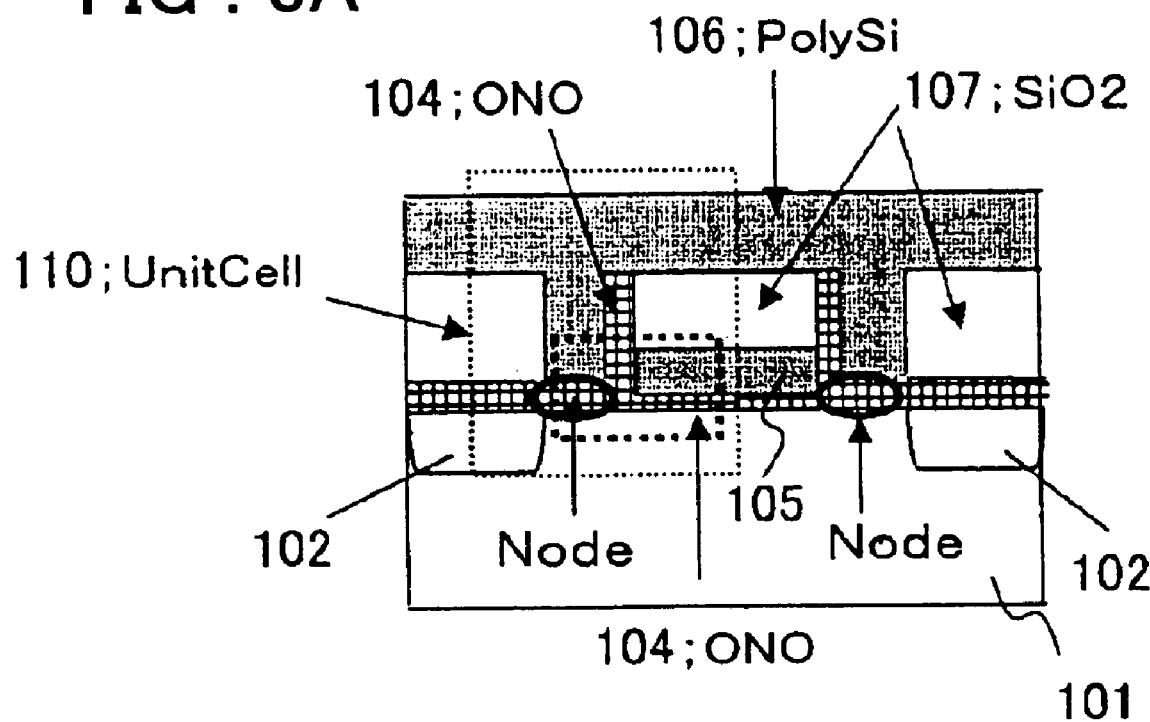
FIG. 3 schematically shows the cross-sectional structure of a third embodiment of the memory cell transistor according to the present invention.
Figure 3B:
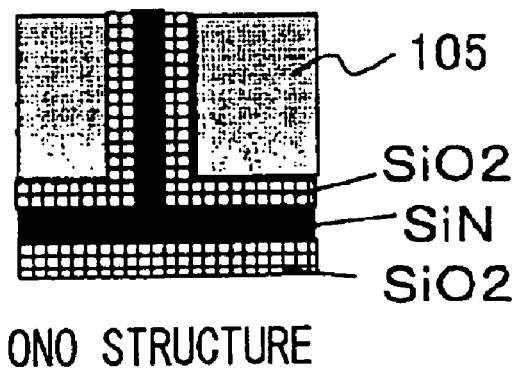

FIG. 3 schematically shows the cross-section of the memory cell transistor according to a third embodiment of the present invention. In the above-described third embodiment, a silicon oxide film 103 is used as a gate insulating film of the control gate, as shown in FIG. 1. In the present embodiment, shown in FIG. 3A, the ONO film 104 is used as a gate insulating film of the control gate. Referring to FIG. 3B, the ONO film 104 is made up by a first silicon oxide film, a silicon nitride film and a second silicon oxide film, laminated together.

Figure 4:
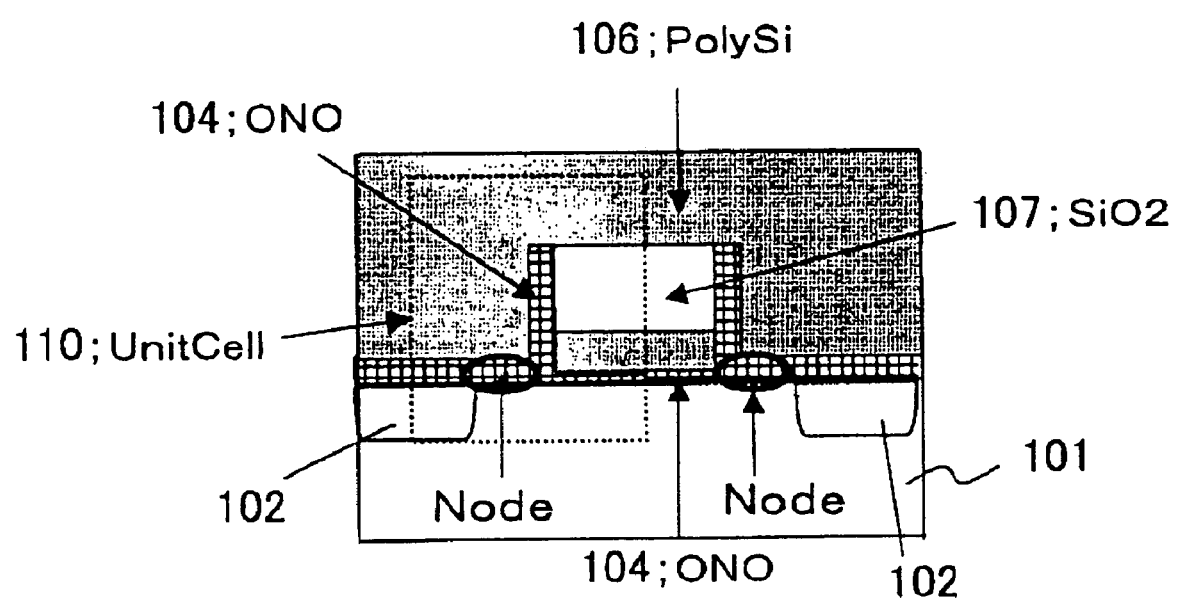
FIG. 4 schematically shows the cross-sectional structure of a fourth embodiment of the memory cell transistor according to the present invention.

FIG. 4 schematically shows the cross-section of a fourth embodiment of the present invention. In the above-described second embodiment, shown in FIG. 2, the silicon oxide film 103 is used as a gate insulating film for the control gate. In the present embodiment, shown in FIG. 4, the ONO film 104 is used as the gate insulating film for the control gate. The present embodiment is otherwise the same as the above described second embodiment.

An embodiment of the manufacturing method for a semiconductor memory device, including a plural number of memory cell transistors, shown in FIG. 1, is hereinafter explained.

FIG. 5A to FIG. 7B are cross-sectional views showing the manufacturing method of the present invention, step-by-step.

Figure 5A:
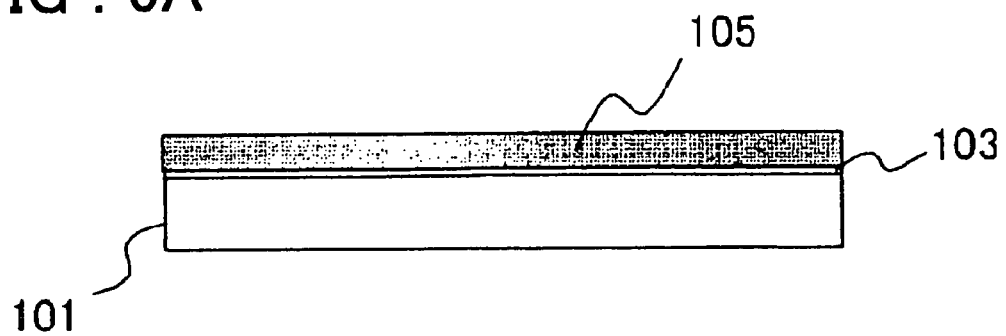
FIGS. 5A to 5C illustrate an embodiment of the manufacturing process of the present invention.
Figure 5B:
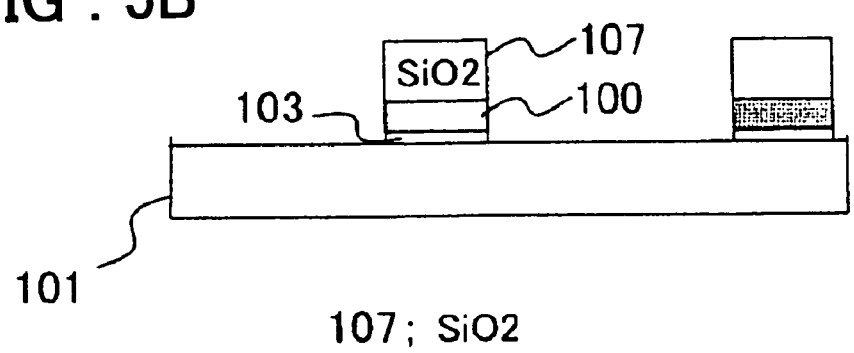

A silicon oxide film 103 (with a film thickness of 15 to 30 nm due to thermal oxidation) is formed on a P-type semiconductor substrate 101, and a polycrystalline silicon film 105 then is formed thereon to a film thickness of 100 to 250 nm (see FIG. 5A). This polycrystalline silicon film is preferably of the N type as a result of processing by a method exemplified by doping polycrystalline silicon with phosphorus or by implanting arsenic impurity ions. The P-type polycrystalline silicon substrate 101 is also preferably of a necessary surface concentration by implanting boron ions, for example.

An upper silicon oxide film 107 is formed on the polycrystalline silicon, by the CVD (chemical vapor deposition)

method, to a film thickness of 200 to 400 nm. This film may be a silicon nitride film or a silicon nitride oxide film. The upper silicon oxide film and the polycrystalline silicon are then selectively removed, using a photo-mask, to form a control gate electrode (see FIG. 5B).

The silicon oxide film on the surface of the P-type silicon substrate 101 is then preferably removed with e.g., hydrofluoric acid to expose the substrate surface.

Figure 5C:
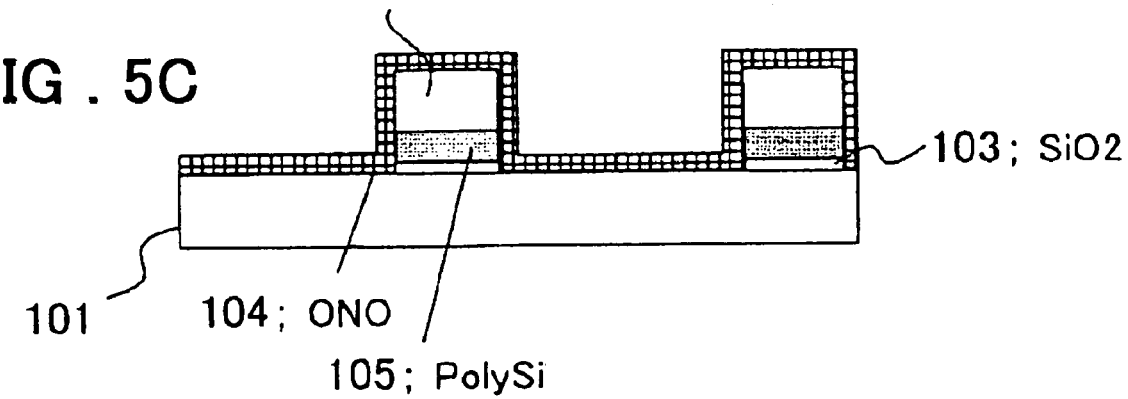

The ONO film 104 is then formed on the surface (see FIG. 5C). The lower film of the ONO film 104, that is the silicon oxide film, is formed to a film thickness preferably of 3 to 9 nm by CVD or by thermal oxidation The film thickness of the silicon nitride film is preferably 3 to 9 nm.

If the upper silicon oxide film of the ONO film 104 is to be formed by oxidizing the silicon nitride film, the film thickness of the silicon nitride film is set such as to take into account the decreased film thickness caused on oxidation.

The upper silicon oxide film of the ONO film 104 may also be formed by CVD or by thermal oxidation of the silicon nitride film. The film thickness of the silicon oxide film on the ONO film 104 is preferably on the order of 3 to 9 nm. It is noted that the ISSG (In Situ Stream Generation) method may also be used as a method for oxidizing the silicon nitride film.

The polycrystalline silicon film (PolySi) is formed by the CVD method to a film thickness of 50 to 100 nm. Meanwhile, the polycrystalline silicon is preferably of N-type containing phosphorus or arsenic as impurities.

Figure 6A:
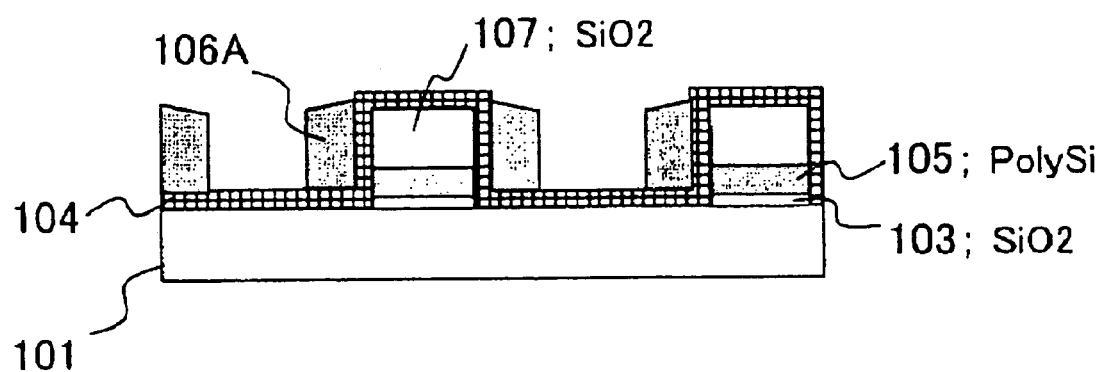
FIGS. 6A and 6B illustrate the embodiment of the manufacturing process of the present invention.

Then, by dry etching, the polycrystalline silicon film (abbreviated as PolySi) 106A is formed as a sidewall to a lateral wall section of the control gate previously formed (see FIG. 6A). The sidewall of the polycrystalline silicon is of a width approximately equal to the film thickness of the as-formed polycrystalline silicon film.

In general, the process variations at the time of film forming are approximately 5%, so that it becomes possible to reduce the process variations of the trap space length to a particularly small value.

Figure 6B:
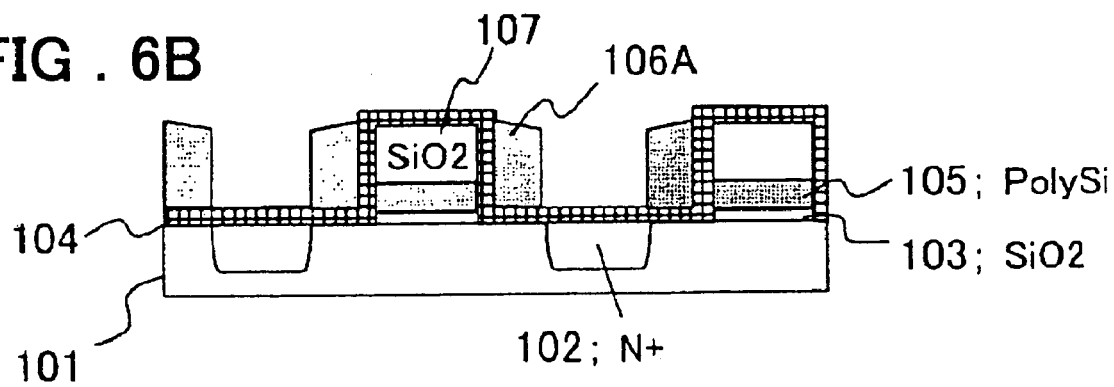

Using the control gate electrode and the sidewall of the polycrystalline silicon film, as a mask, As ions are implanted with an energy sufficient for the ions to be transmitted through the ONO film 104, to form a N+ diffusion region 102 (see FIG. 6B). The amount of dosage is preferably on the order of 5E14 to 5E15 $cm^{-2}$. After ion implantation, heat treatment in a nitrogen atmosphere may be carried out if necessary. In implanting the As ions, a mask is provided in an area overlying the embedded N+ diffusion region (111 of FIG. 8).

Figure 7A:
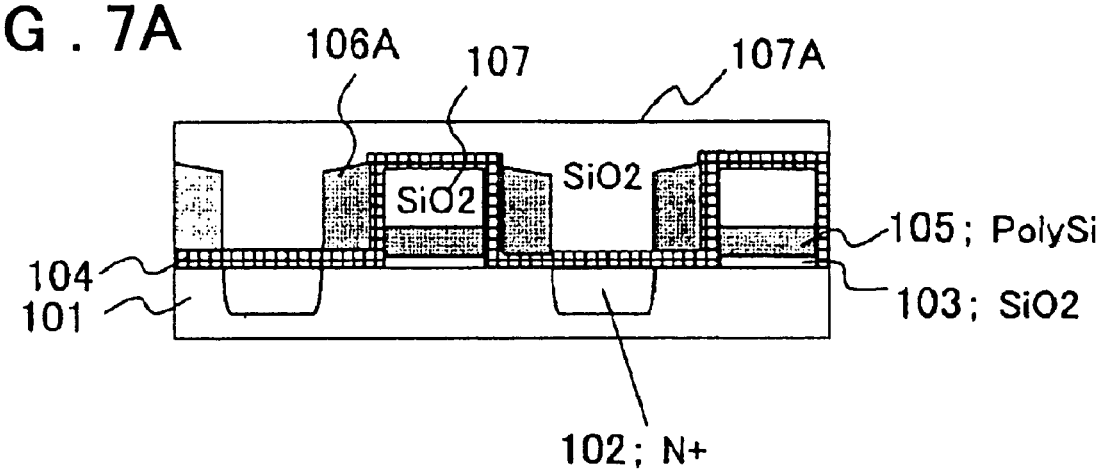
FIGS. 7A and 7B illustrate the embodiment of the manufacturing process of the present invention.
Figure 7B:
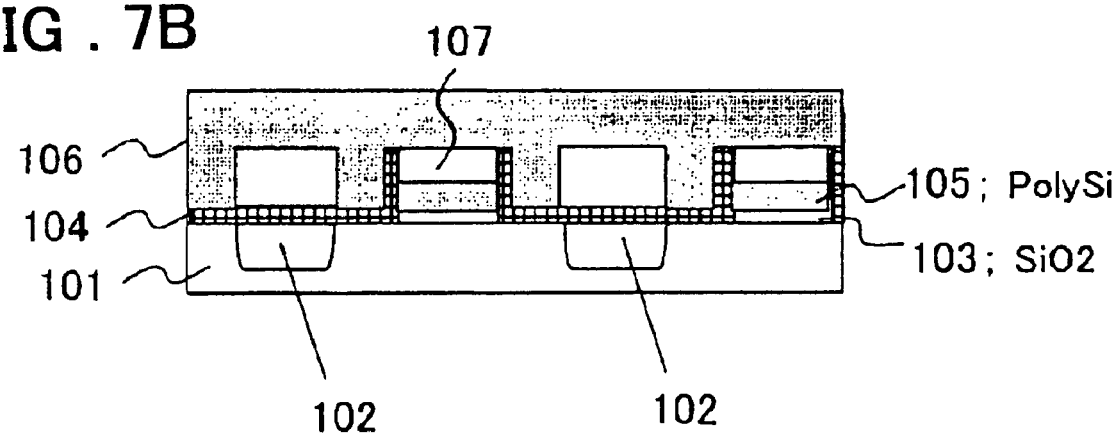

A silicon oxide film 107A then is formed on the entire substrate surface (see FIG. 7A). During this process, the silicon oxide film 107A is formed by the CVD method. It is sufficient that the thickness of the film on growth is such a film thickness that the space between the control gate electrodes is charged with the silicon oxide film 107A. In particular, the HDP (high density plasma CVD), for example, may be used for improving the embedding characteristics. It is of course possible to form e.g., a BPSG (borophospho silicate glass) film and to put the film so formed to heat treatment for reflow.

The silicon oxide film 107A is then polished, using the CMP (chemical mechanical polishing) technique. The point to which attention should be directed is that an upper portion of the sidewall polycrystalline silicon 106A should be exposed without exposing the polycrystalline silicon film 105 of the control gate electrode. In place of the CMP, etchback of the silicon oxide film by dry etching or wet etching may, of course, be used.

A polycrystalline silicon film 106 then is formed on the entire substrate surface. The polycrystalline silicon used is preferably of the N type doped with impurities, such as phosphorus or arsenic (see FIG. 7B).

Using the photoresist, not shown, as a mask, the polycrystalline silicon deposited and polycrystalline silicon formed on the control gate sidewall are selectively removed to form word lines.

A low resistance material, such as WSi, may be deposited on the polycrystalline silicon 106 forming the word line. Alternatively, a high melting metal silicide process may also be applied.

In the manufacture of the cell transistor of the second embodiment of the present invention, shown in FIG. 2, it is also possible to form the N+ diffusion region 102 by self-alignment of FIG. 6B. Then the polycrystalline silicon film 106 is deposited on the entire substrate surface and the so formed film is polished to form the cross-sectional structure shown in FIG. 2. Then the word line patterns are formed. At this step, a polycrystalline silicon film formed on the control gate sidewall is selectively removed and the deposition of the insulating film of e.g., silicon oxide is effected. The second embodiment of the method for manufacturing the cell transistor according to the present invention, shown in FIG. 3, differs from the second embodiment in that, in FIG. 5A, the ONO film, composed of the silicon oxide film, silicon nitride film and the silicon oxide film, is formed as a gate insulating film (103 of FIG. 5A) on the P-type silicon substrate 101.

Figure 8:
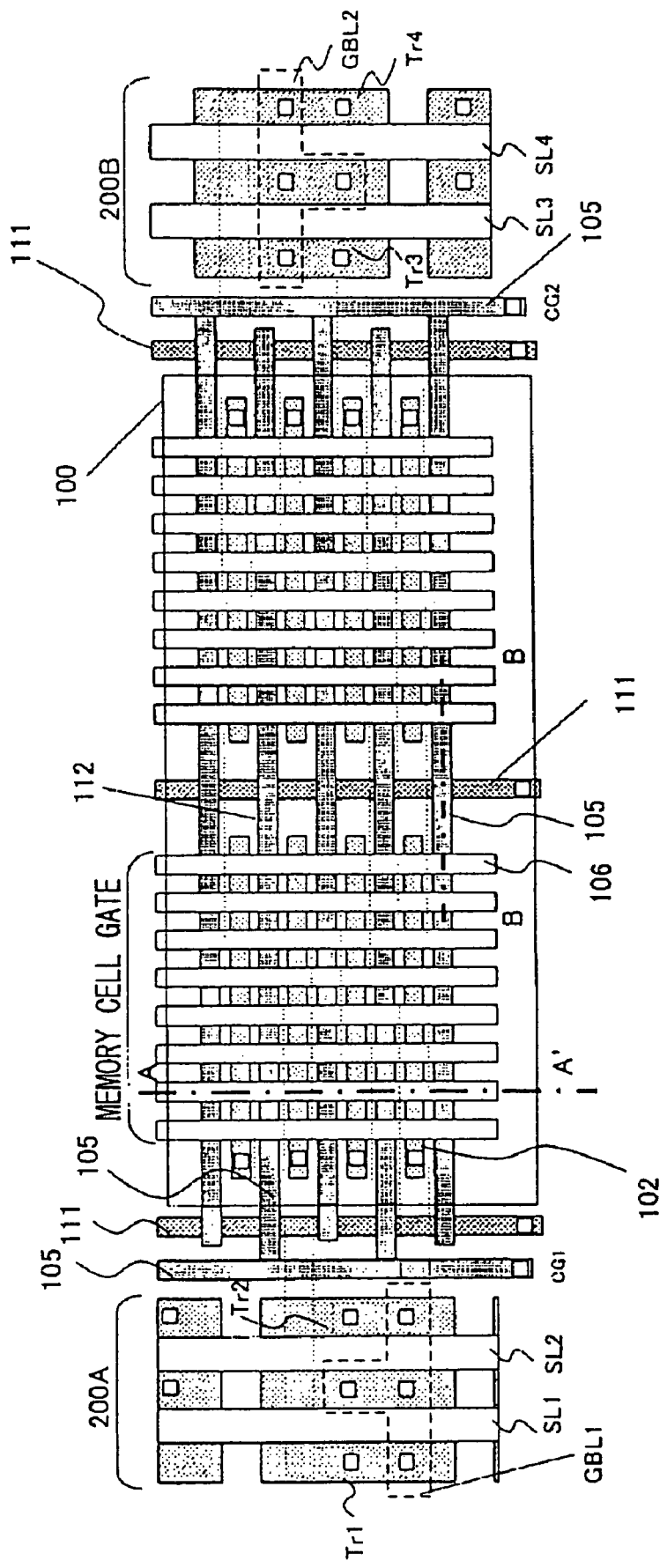
FIG. 8 shows the structure of an embodiment of a memory cell array according to the present invention.

The structure of the memory cell array of an embodiment of the present invention is hereinafter explained. FIG. 8 shows the structure of a memory cell array of an embodiment of the present invention.

Referring to FIG. 8, the memory cell array includes a plural number of rows of N+ diffusion regions 102, also termed bit diffusion regions, provided for extending in one direction (transverse direction of the drawing) of the substrate surface in separation from one another, and which are connected by contact to the bit lines. There are also provided buried N+ diffusion regions 111, also termed buried diffusion regions, at the locations in the substrate surface spaced apart from the longitudinal ends of the plural rows of the diffusion regions 102, for extending in a direction at right angles to the above one direction, that is the vertical direction in the drawing. There are provided plural word line electrodes 106, provided on the substrate via an insulating film, not shown, for extending in a direction at right angles to the longitudinal direction of the diffusion region 102. There are also provided plural control gate electrodes 105 on the substrate via an insulating film, not shown, for extending in one direction between neighboring rows of the diffusion regions 102. These control gate electrodes 105 three-dimensionally intersect the buried diffusion regions 111 (see FIG. 9B) in FIG. 8, via an insulating film, not shown. In FIG. 8, the two neighboring rows of the diffusion regions 102, word line electrodes 106 between the two neighboring rows of the diffusion regions 102 and the control gate electrode 105 make up a two-bit memory cell. Moreover, the control gate 105 towards an edge of the memory cell array, one row of the diffusion regions 102 and the word line 106 make up one bit unit cell.

In the embodiment shown in FIG. 8, bank selection units 200A and 200B are provided on both sides of the memory cell diffusion region area 100, also termed a memory cell area.

The bank selection unit 200A includes first and second selection transistors Tr1 and Tr2, each having one of the diffusion regions, which is to become a source or a drain, connected by a via-hole to a global bit line GBL1, arranged in the second aluminum wiring layer, and each having the gate electrode connected to the selection lines SL1 and SL2, while having the other diffusion region, which is to become a drain or a source, connected to second and fourth bit lines 112 of the first aluminum wiring layer.

The bank selection unit 200B includes first and second selection transistors Tr3 and Tr4, each having one of the diffusion regions, which is to become a source or a drain, connected by a via-hole to a global bit line GBL2, arranged in the second aluminum wiring layer, each having the gate electrode connected to the selection lines SL3 and SL4, and each having the other diffusion region, which is to become a drain or a source, connected to second and fourth bit lines 112 of the first aluminum wiring layer Thus, the second and fourth bit lines are extended from the bank selection unit 200A through the memory cell area 100 towards the bank selection unit 200B, while the first and third bit lines are extended from the bank selection unit 200B through the memory cell area 100 towards the bank selection unit 200A.

The memory cell array has a set of eight word line electrodes 106 as a unit. In the embodiment shown in FIG. 8, two such sets, each composed of the eight word line electrodes, are arranged, with the set of the eight word line electrodes as a unit. Of course, the present invention is not limited to the configuration of the two sets each composed of the eight word lines as a unit.

On each side of the sets, there is provided a buried diffusion region 111. Three of such buried diffusion regions 111 are provided for the two sets. By providing the buried diffusion regions 111 on both sides of the set (sub-array) of the memory cell array, the read current may be increased, as will be explained subsequently.

The control gate electrodes 105, arranged through a space between the diffusion regions 102 on the substrate of the memory cell area 100, are alternately connected to the control gate base sections (control gate terminals) CG1 and CG2, arranged on both sides of the memory cell area 100. The control gate terminals CG1 and CG2, arranged on both sides of the memory cell area 100, and the control gate electrodes 105 of the memory cell area 100, are formed of the same electrically conductive material, and is patterned simultaneously during the manufacture process shown in FIG. 5B.

Between the buried diffusion regions 111 on both sides of the memory cell area 100 and the bank selection units 200A and 200B, the control gate terminals CG1 and CG2 are arranged parallel to the longitudinal direction of the word line 106.

The control gate electrodes 105 are extended from the control gate terminal CG1 through the area defined between the diffusion regions 102 towards the control gate terminal CG2, over the ends of the memory cell area 100 and the buried diffusion regions 111, while the control gate electrodes 105 are extended from the control gate terminal CG2 through the area defined between the diffusion regions 102 towards the control gate terminal CG1, over the ends of the memory cell area 100 and the embedded N+ diffusion regions 111.

Figure 9A:
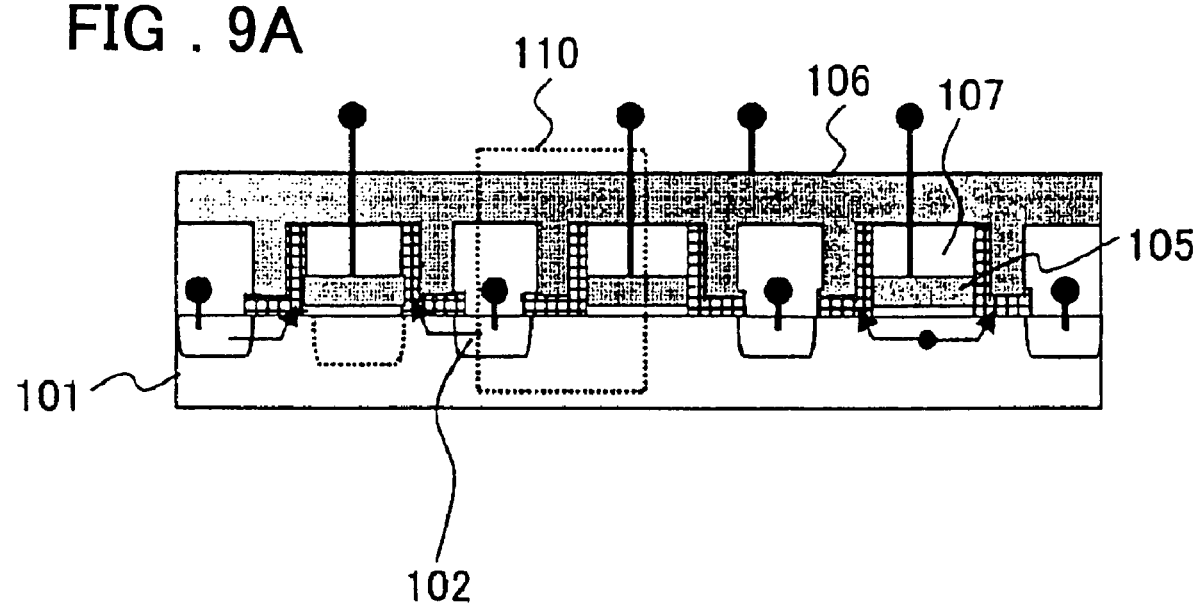
FIGS. 9A and 9B are cross-sectional views taken along lines A-A' and B-B' of FIG. 8, respectively.
Figure 9B:
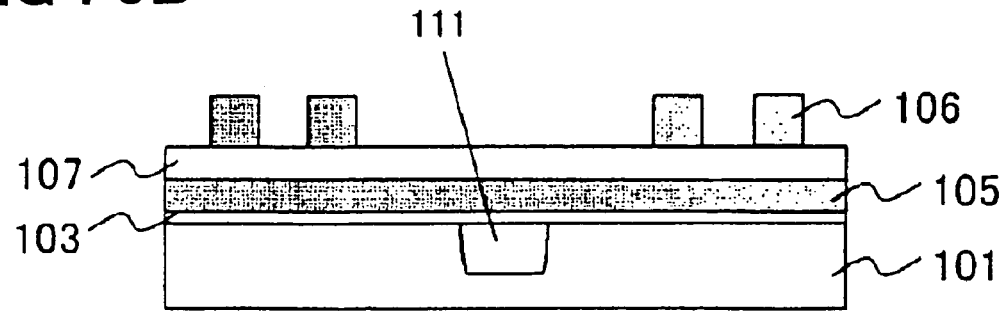

FIGS. 9A and 9B show the cross-sections taken along lines A-A' and B-B' of FIG. 8, respectively. The unit cell 110, shown in FIG. 9A, is of the same structure as the unit cell 110 of the first embodiment shown in FIG. 1. This cell has such structural features as a self-alignment type control gate and MONOS structure.

During the programming operation, the channel below the control gate operates as a source.

Moreover, during the cell erasure operation, that is, during injection of hot holes into the electron trapping region, the cell erasure operation is carried out with the potential directly below the control gate electrode 105, as a barrier against the holes.

Referring to FIG. 9B, during programming, the control gate 105 is arranged through the silicon oxide film 103 over the embedded N+ diffusion region 111, which supplies the potential to the channel of the control gate, while the word line electrode 106 is arranged through the silicon oxide film 107 for extending in a direction perpendicular to the control gate electrode 105.

Figure 10:
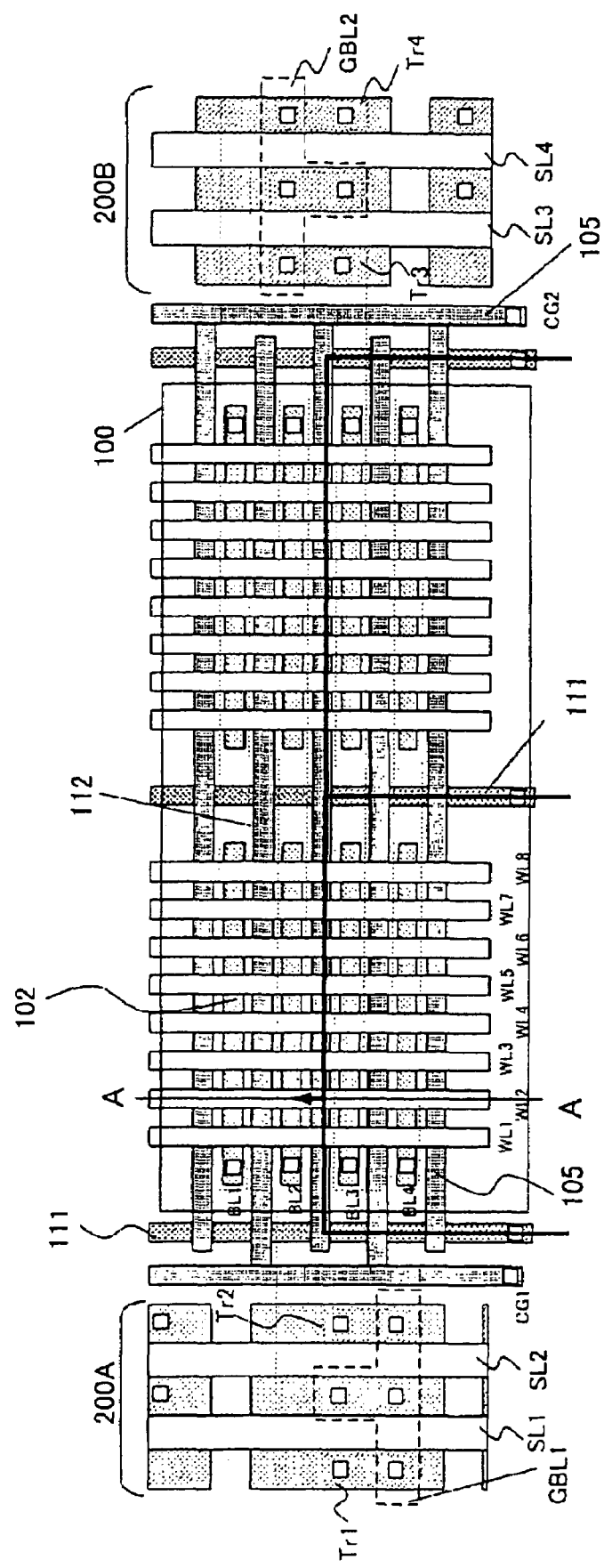
FIG. 10 shows the programming operation in an embodiment of the memory cell array according to the present invention.
Figure 11:
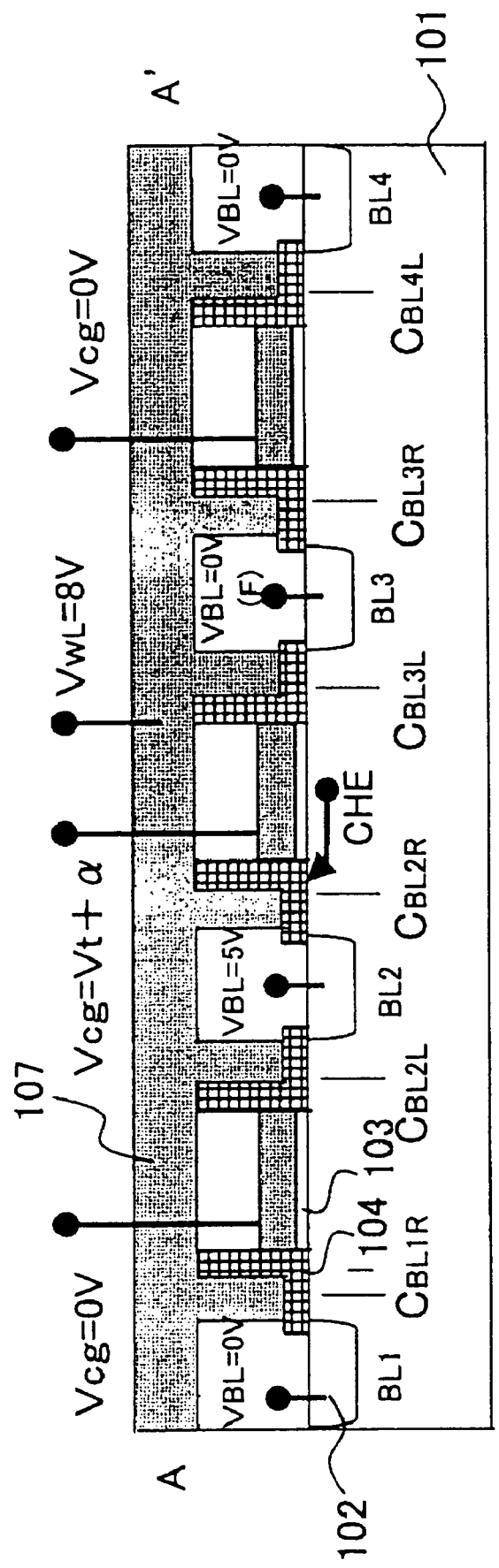
FIG. 11 shows the bias setting and the programming operation in the cross-section taken along line A-A' of FIG. 10.

The programming operation of the memory cell array of an embodiment of the present invention is now explained. FIG. 10 illustrates the programming operation to the node of the cell selected in FIG. 8. FIG. 11 is a cross-sectional view taken along line A-A' of FIG. 10. FIG. 10 shows the flow of electrons when the word line WL2 is selected and when programming is made in a right side node (cell) CBL2R (see FIG. 11) of the bit line BL2 in the arrangement shown in FIG. 8.

Referring to FIGS. 10 and 11, when programming is effected in the memory cell CBL2R, the write voltage 5V is applied to the bit line BL2, while the gate voltage Vt+α, which will cause the current of approximately 1 μA to flow, is applied to the control gate terminal CG2 arranged between the diffusion region 102 of the bit line BL2 and the diffusion region 102 of the bit line BL3 (Vt denotes a threshold voltage, with α≧0).

The electrons used for programming (hot electrons) are supplied from the buried diffusion regions 111 through the control gate terminal CG2. The so supplied electrons are injected into the ONO film by the word line potential VWL (8V). In FIG. 11, the arrow entered in an intersection between the word line WL2 and the bit line BL2 represents injection into the cell CBL2R of channel hot electrons (CHE) from the control gate channel, and is in keeping with the an arrow indicating CHE injection into the node of FIG. 11. Meanwhile, the control gate CG1 is at 0V (ground potential).

Figure 12:
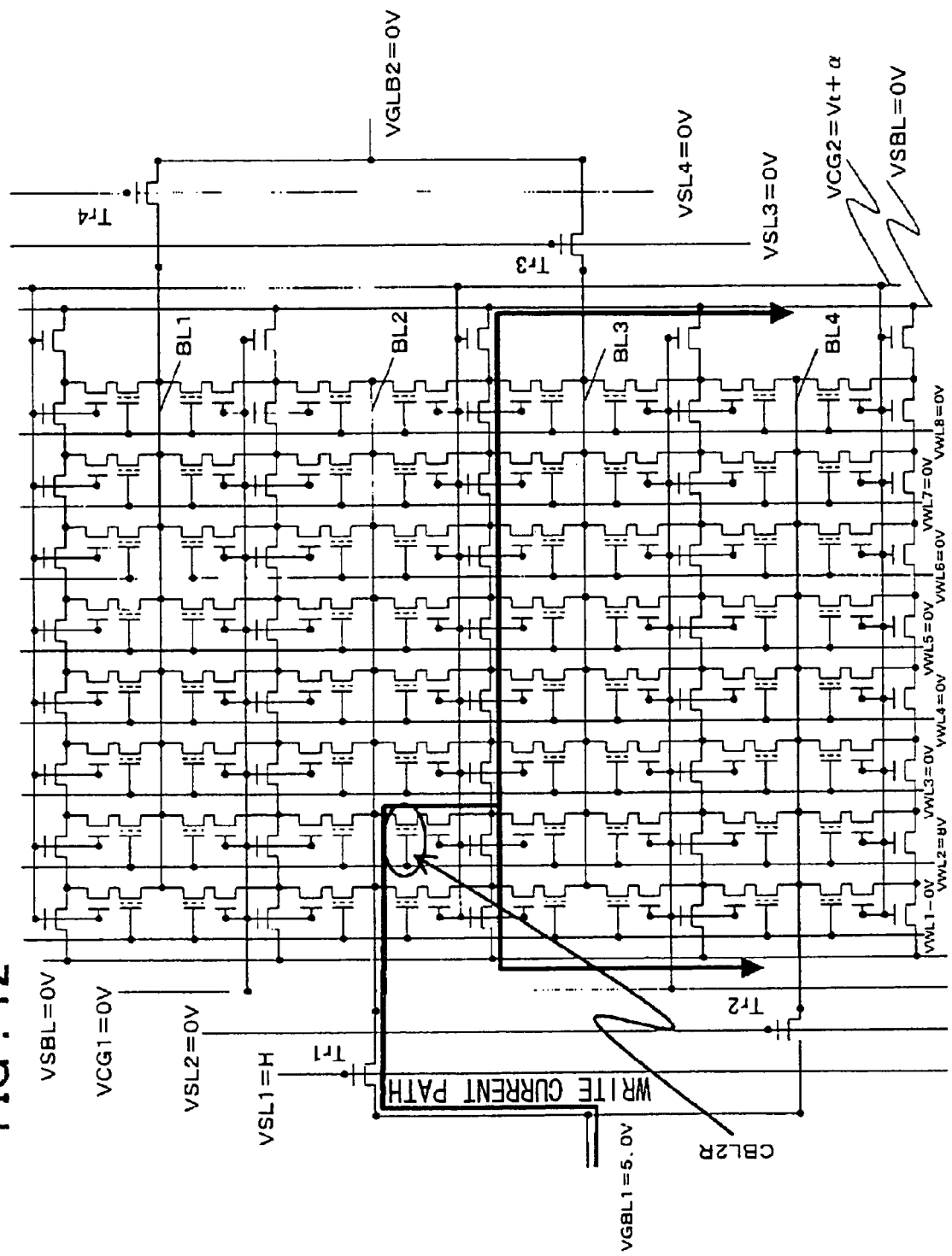
FIG. 12 depicts an equivalent circuit showing the programming operation in the embodiment of the present invention.

FIG. 12 depicts an equivalent circuit of the memory cell array shown in FIG. 10 and specifically shows the selection of the word line WL2 and the programming in the right side node CBL2R (see FIG. 11) of the bit line BL2

Of the control gates arranged between the diffusion regions 102 on the substrate shown in FIG. 9, in the equivalent circuit of FIG. 12, the control gate, arranged between neighboring word line electrodes, such as the control gate arranged between the cells CBL2R and CBL3L, is represented, in the equivalent circuit of FIG. 12, by a pass transistor connected in tandem along the word line and a source of the write cell (CBL2R), the drain diffusion region of which is connected to the bit line BL2.

The VGBL1 is the voltage applied to the global bit line GBL1 and is set to 5V.

The VSL1 is the voltage on the bank selection line SL1, connected to the gate of the bank selection transistor Tr1 connected to the bit line BL2, and is at an H level. The bit line BL2 is supplied with the voltage of the global bit line GBL1=5V via transistor Tr1 in the on state.

The VCG1 and VCG2 depict voltages to the control gate electrode, with VCG1=0V and VCG2=Vt+α.

The VSL2 is the voltage of the bank selection line SL2, connected to the gate of the bank selection transistor Tr2, and is at an L level (non-selection).

The VSBL is a voltage applied to the embedded N+ diffusion regions 111 and is 0V.

The VGBL2 is a voltage applied to the global bit line GBL2 and is 0V (non-selection).

The VSL3 is a voltage to the bank selection line SL3 and is at an L level, while the VSL4 is a voltage applied to the bank selection line SL4 and is at an L level.

The write current pass is connected from the global bit line GBL1 through the selection transistor Tr1 to the bit line BL2, such that approximately 5V is applied to the drain of the write cell (transistor) connected to the selected word line WL2 (VWL2=8V), while the source side diffusion region of the cell transistor is connected to the buried diffusion region 111 via transistor connected common to the control gate electrode CG2.

The current flows from the write cell through the control gate channel to the embedded N+ diffusion regions 111 (voltage VSBL=0V) on both sides of the memory cell area. That is, electrons are injected by source side injection from both sides embedded N+ diffusion regions 111 to the write cell.

Figure 13:
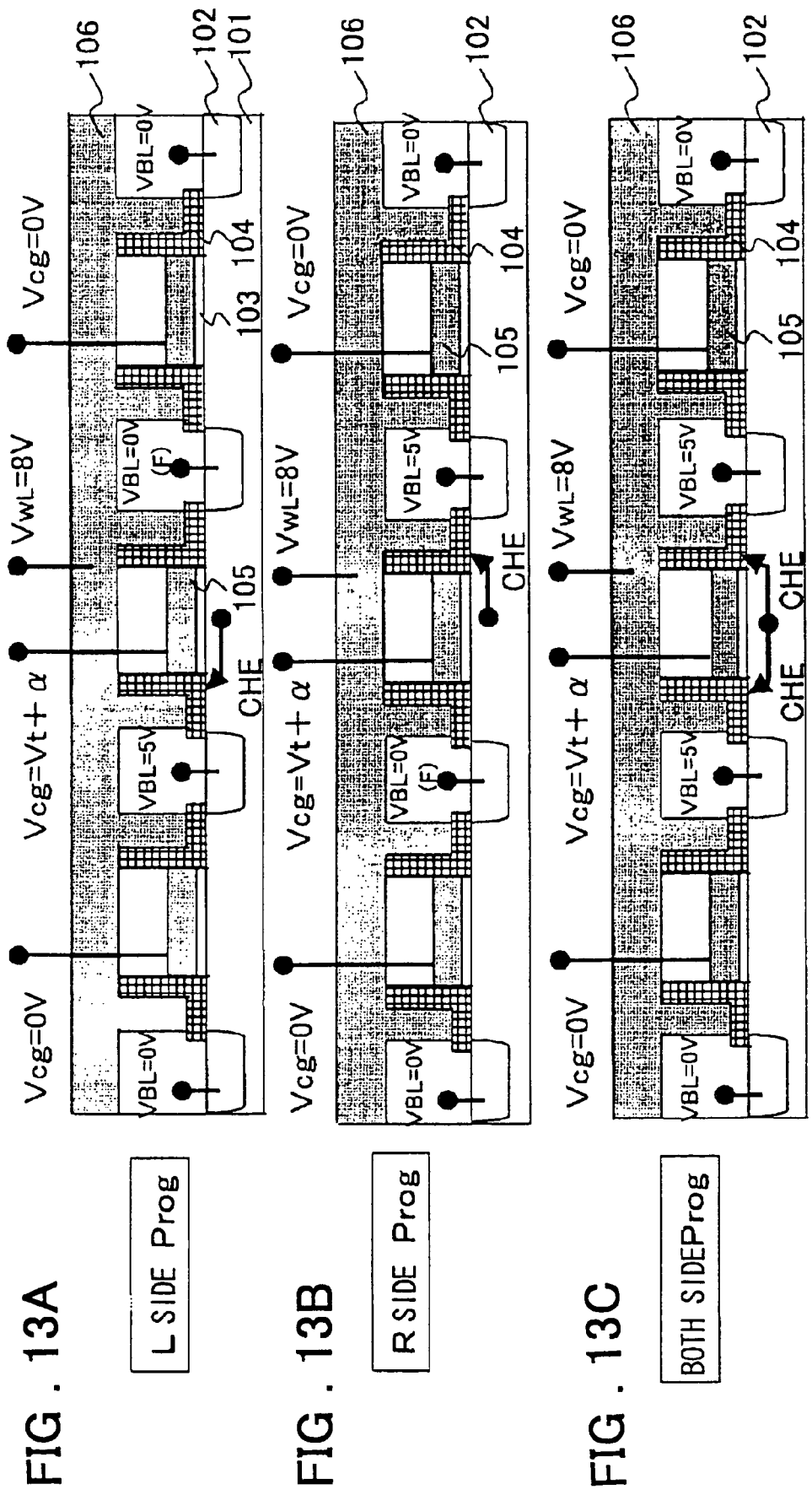
FIGS. 13A to 13C show the programming operation in a new file memory in the cross-section taken along line A-A' of FIG. 10, with FIG. 13A illustrating the operation of an L side program, FIG. 13B illustrating the operation of an R side program and FIG. 13C illustrating the operation of L and R side programs.

FIG. 13 illustrates the programming operation of the present embodiment in further detail.

Referring to FIG. 13A, if programming is to be performed in the left side of the control gate (L side write), the voltage Vcg of the control gate electrode 105 is set to Vt+α, that of the diffusion region on the left side of the control gate is set to 5V (VBL=5V), that of the buried diffusion region 111 is set to 0V, that of the word line is set to 8V, that of the diffusion region on the right side of the control gate is set to 0V or floating (VBL=0(F)) and that of the other diffusion regions is set to 0V (VBL=0). The non-selected control gate electrodes are set to 0V (Vcg=0V).

Referring to FIG. 13B, if programming is to be made in the storage node on the right side of the control gate (R side programming), the bias condition which is the reverse of that in the L side programming is set. The voltage Vcg of the control gate electrode is set to Vt+α, where Vt is the threshold voltage, that of the diffusion region on the right side of the control gate is set to 5V (VBL=5V), that of the buried diffusion region 111 is set to 0V, that of the word line is set to 8V, that of the diffusion region on the left side of the control gate is set to 0V or floating (VBL=0(F)) and that of the other diffusion regions is set to 0V (VBL=0).

Referring to FIG. 13C, if programming is to be performed in the left and right sides of the control gate, the voltage Vcg of the control gate electrode is set to Vt+α, that of the diffusion regions on the right and left sides of the control gate is set to 5V (VBL=5V), that of the buried diffusion region 111 is set to 0V, and that of the other diffusion regions is set to 0V (VBL=0). Channel hot electrons are injected from the control channel to both side storage nodes.

In the present embodiment, it is possible to diminish the write current and to write in a large number of cells in parallel. The interference current to neighboring cells is zero (pre-charge of the non-selected line is unnecessary).

Figure 14:
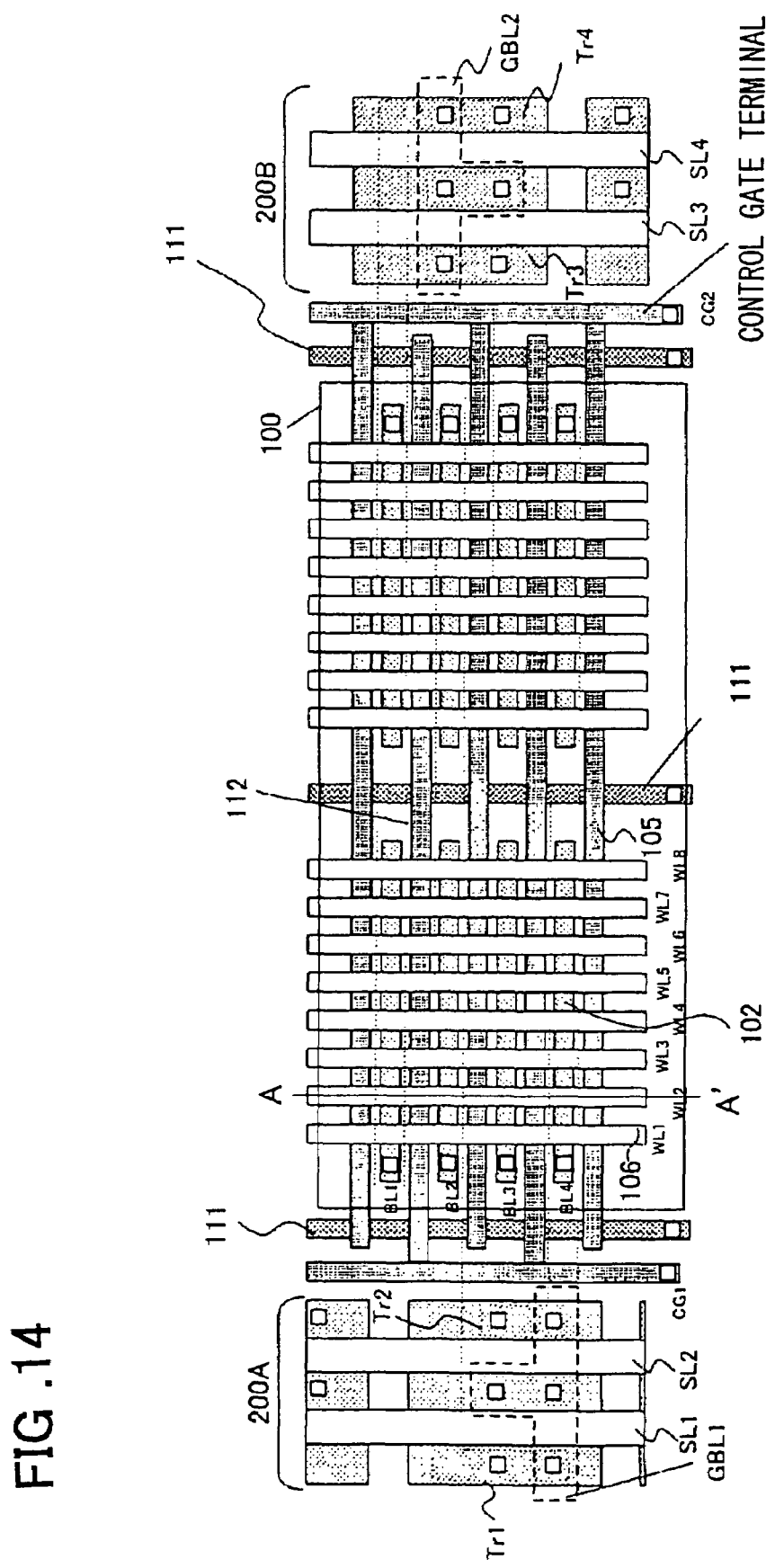
FIG. 14 shows an erasure operation in an embodiment of the memory cell array according to the present invention.
Figure 15:
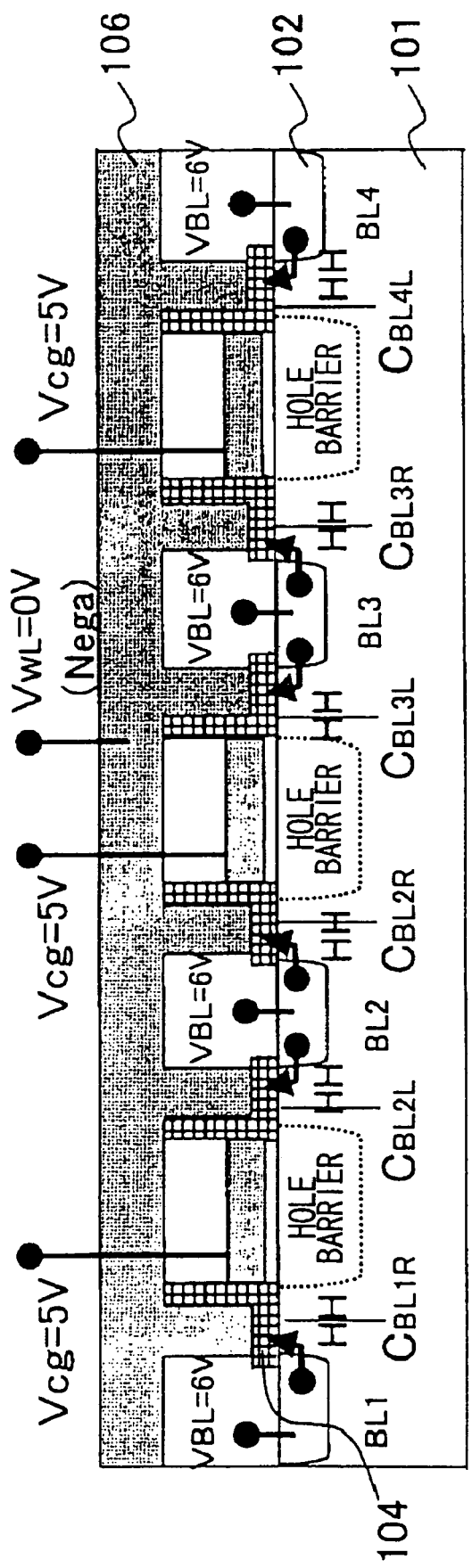
FIG. 15 shows the bias setting and the erase operation in the cross-section taken along line A-A' of FIG. 14.

The erase operation in a memory cell array in an embodiment of the present invention is explained. FIGS. 14 and 15 depict the cross-sections of the embodiment of the present invention for illustrating the layout and erasure operations of the memory cell array according to an embodiment of the present invention, respectively.

In an embodiment of the present invention, collective (flash) erasure may be performed. That is, an erase voltage of 6V is applied to the totality of the bit diffusion regions 102 of the memory cell array and hot holes (HH) are generated by band-to-band tunneling. In the present embodiment, a hole barrier is generated for concentrating the holes generated by the band-to-band tunneling to the vicinity of the storage node (see FIG. 15).

As for the potential, providing this barrier, the potential of the control gate electrode 105 is set to 5V, while a potential lower than the voltage of the control gate electrode 105, such as 3V, is set in the embedded N+ diffusion regions 111 (VSBL=3V). This prohibits the diffusion of the holes to provide for efficient erasure, The concentrated holes are lifted to the ONO film 104 by the 0V or negative potential of the word line to induce electron-hole recombination. If, on the contrary, no hole barrier is formed, hot holes are diffused through the channels, without being concentrated in the vicinity of the storage node, to render it difficult to raise the efficiency in electron-hole recombination.

Figure 16:
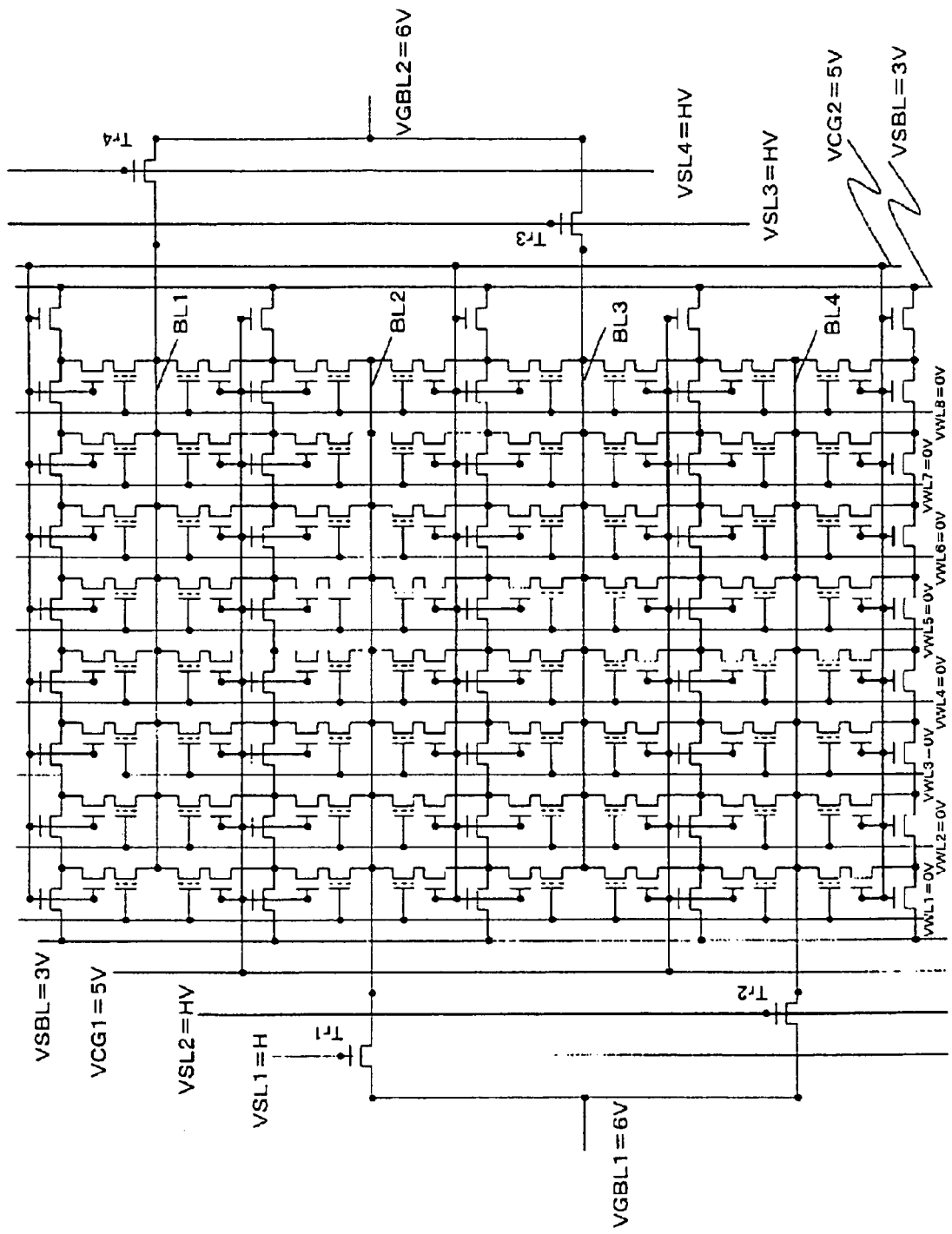
FIG. 16 depicts an equivalent circuit showing an arrangement of FIG. 14 performing an erase operation in an embodiment of the present invention.

FIG. 16 shows an equivalent circuit showing the layout of the memory cell array shown in FIG. 14 and illustrates the flash erase operation.

The VGBL1 is a voltage of the global bit line GBL1 and is 6V.

The VSL1 is a voltage on a bank selection line SL1 connected to the gate of a bank selection transistor Tr1, connected in turn to the bit line BL2, and is at an H level. To this bit line BL2 is supplied the voltage VGBL1 on the global bit line GBL1=6V. The VSL2 is a voltage on a bank selection line SL2 connected to the gate of a bank selection transistor Tr2, and is at an H level. To the bit line BL4 is supplied the voltage VGBL1 on the global bit line GBL1=6V.

The VSBL is a voltage supplied to the embedded N+ diffusion regions 111 and is 3V. The VCG1 and VCG2 are voltages of the control gate electrode 105 and is 5V.

The word lines WL1 to WL8 in their entirety are assumed to be at 0V.

The VGBL2 is a voltage of the global bit line GBL2 and is 6V. The VSL3 is a voltage on the bank selection line SL3, connected to the gate of the bank selection transistor Tr3, and is at an H level. The VSL4 is a voltage on the bank selection line SL4, connected to the gate of the bank selection transistor Tr4, and is at an H level. To the bit lines BL1 and BL3 is supplied the voltage VGBL2 on the global bit line GBL2=6V.

FIG. 17 illustrates the erasure operation in an embodiment of the present invention, and illustrates the cross-sectional view of FIG. 15 in keeping with respective states. Referring to FIG. 17, the erase operation of the present embodiment is explained. In the present embodiment, a pre-program is raised in speed and flash-erased.

FIG. 17A shows the as-programmed state (state in which electrons are trapped in a storage node).

Referring to FIGS. 17B, the storage node not programmed is pre-programmed. In the present embodiment, L side programming and R side programming may be performed independently of each other.

In FIG. 17B, channel hot electrons (CHE) are injected into a node (Node). The voltages on the control gate, word line VWL, bit diffusion region 102 close to the write node, source side diffusion region and on the buried diffusion region 111 are set to Vt+α, 8V, 6V, 0V (VBL=0V) and to 0V, respectively, to effect pre-programming by source side injection.

Referring to FIG. 17C, the voltages on the word line, bit line diffusion region and on the control gates (CG1, CG2) to 0V (or a negative voltage), 6V (VBL=6V) and 5V (Vcg=5V), respectively, to effect flash erasure of the memory cell area.

Figure 18:
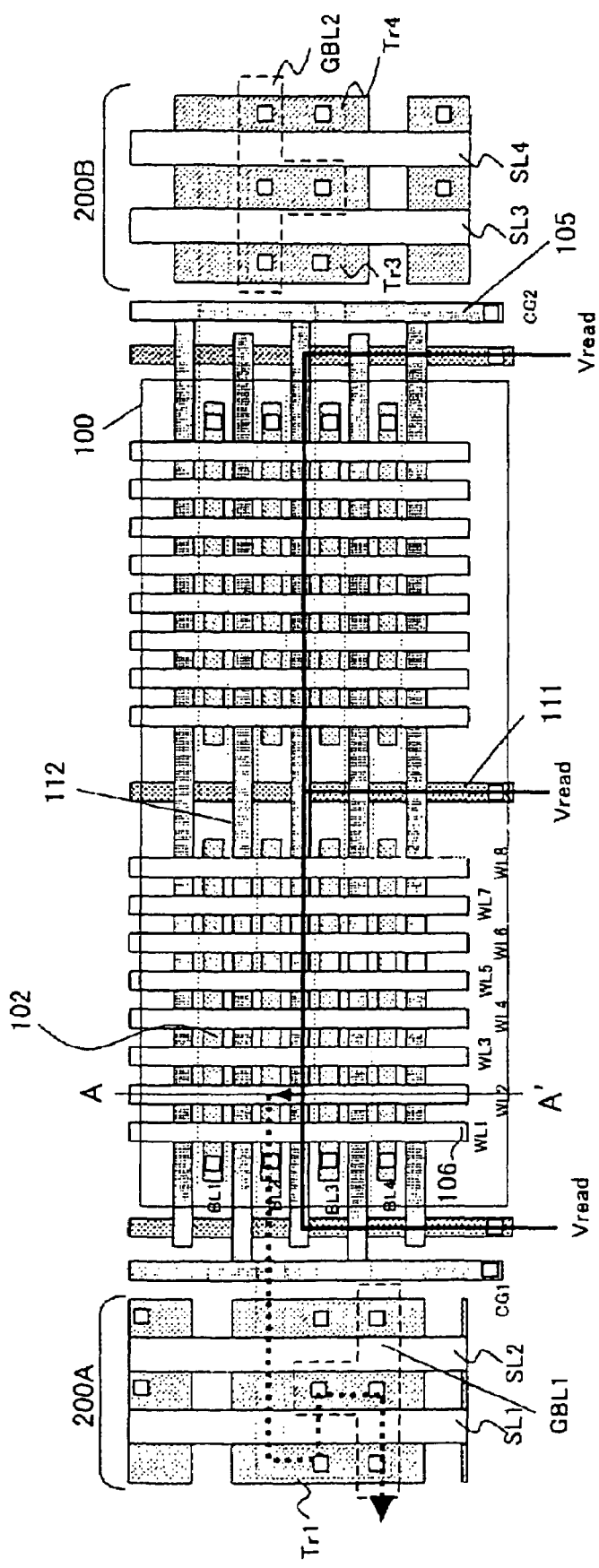
FIG. 18 shows the read operation in an embodiment of a memory cell array according to the present invention.
Figure 19:
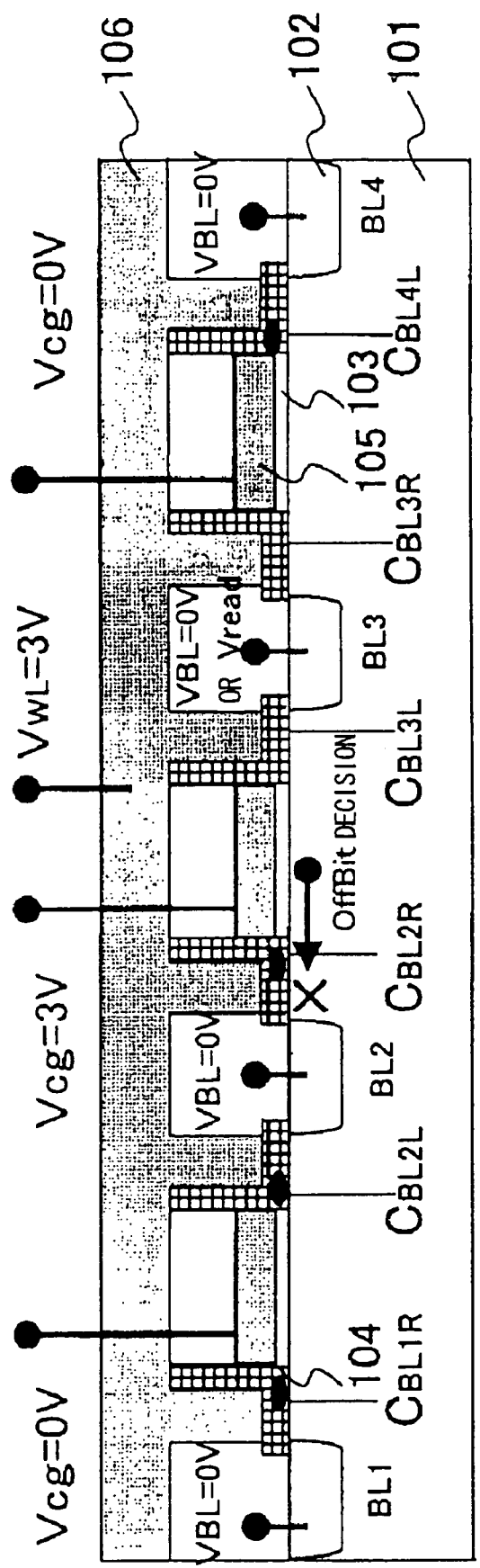
FIG. 19 shows the bias setting and the read operation in a cross-section taken along line A-A' of FIG. 18.

The read (Read) operation in a memory cell array of an embodiment of the present invention is now explained. FIG. 18 illustrates the Read operation in the layout of the memory cell array of an embodiment of the present invention. FIG. 19 schematically shows the cross-section taken along line A-A' of FIG. 18. The layout structure shown in FIG. 18 is the same as that shown in FIG. 10. However, the layout structure of FIG. 18 shows the read current for a cell connected to the word line WL2 and to the bit line BL2 (current path from a bit line through a selection transistor to the global bit line).

In reading the memory cell CBL2R (see FIG. 19), the read voltage (Vread) of, for example, 1 V, is applied to the N+ buried diffusion regions 111.

To the control gate CG2, a voltage of, for example, 3V, is applied (Vcg=3V) to apply the drain voltage to the selected cell. To the word line WL2 is applied a read gate voltage of, for example, 3V (VWL=3V).

If the threshold value of a selected cell has been programmed to 3V or higher, the channel directly below the storage node is off, such that there flows no channel current.

If the selected cell is not programmed, the channel is turned on such that the current flows through a path indicated by a broken line in the drawing, that is, a path from the bit line BL2 through the selection transistor in the on-state to the global bit line to a sense circuit, not shown.

If, in reading with the buried diffusion regions 111 as the drain, a sense circuit, not shown, is connected to the drain side, leak current tends to be mis-detected. In this consideration, connection to the source side of the memory cell may be made to achieve read with higher sensitivity.

Moreover, in read, the voltage on the control gate electrode neighboring to the control gate of the read cell (Vcg=3V) may be set to 0V to eliminate the current leakage to the neighboring bit line to assure facilitated circuit designing.

Figure 20:
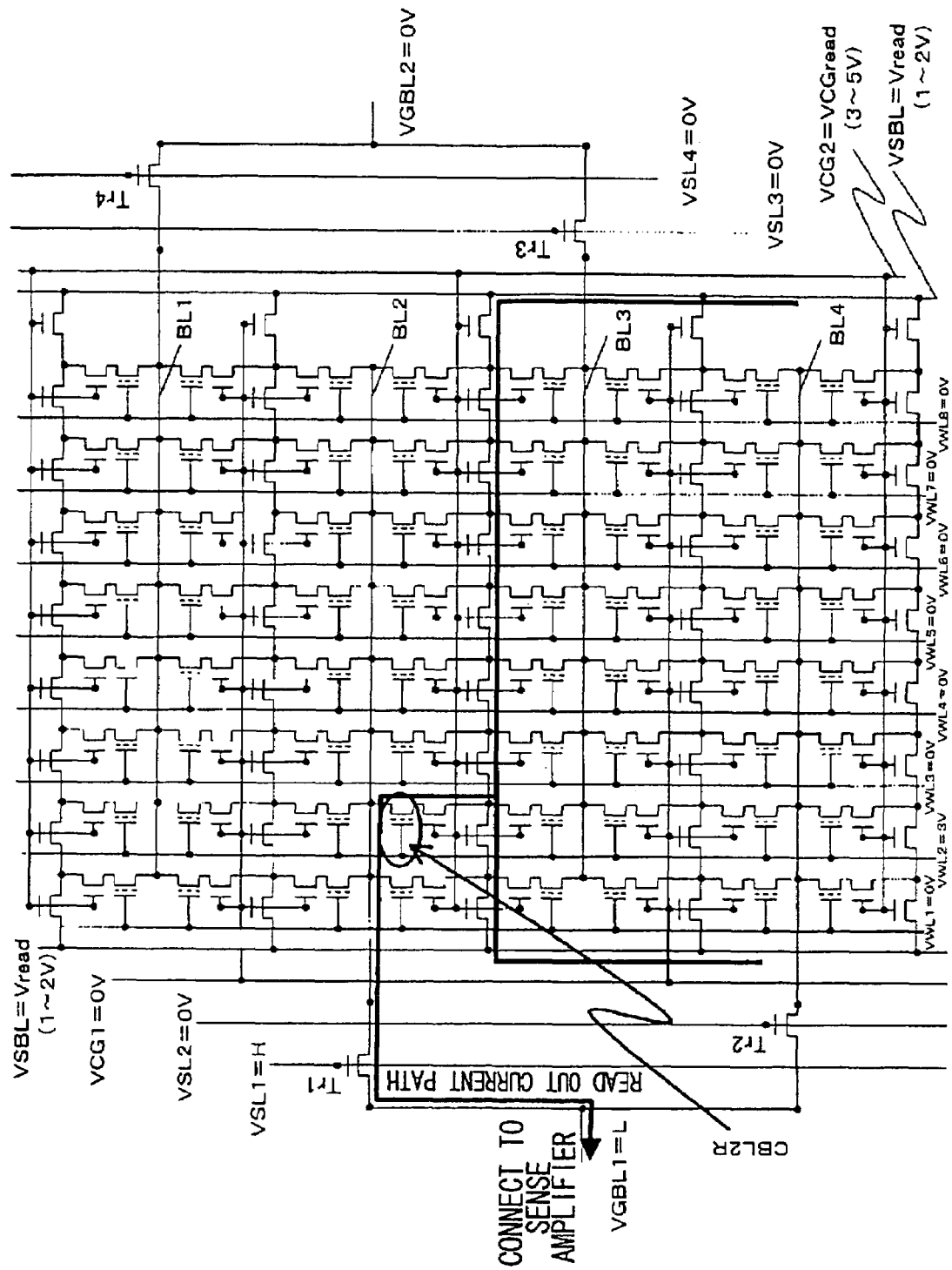
FIG. 20 depicts an equivalent circuit showing an arrangement of FIG. 18 performing a read operation in an embodiment of the present invention.

FIG. 20, which shows an equivalent circuit of the layout of the memory cell array shown in FIG. 18, illustrates the cell read operation. In FIG. 20, the read cell corresponds to the cell CBL2R of FIG. 19.

The voltage VGBL1 on the global bit line GBL1 is at an L level.

The voltage VSL1 on the bank selection line SL1, connected to the gate of the bank selection transistor Tr1, connected in turn to the bit line BL2, is at an H level. The voltage VSL2 is a voltage on the bank selection line SL2 connected to the gate of the bank selection transistor Tr2, and is 0V (non-selection).

The voltage VCG1 is a voltage on the control gate electrode 105 (CG1) and is 0V, while the voltage VCG2 is a voltage on the control gate electrode 105 (CG1) and is VCGread (3 to 5V).

The VSBL is a voltage supplied to the embedded N+ diffusion regions 111 and is VCGread (1 to 2V).

The voltage on the word line WL2 is set to 3V (VWL2=3V).

The voltage VGBL2 is a voltage on the global bit line GBL2 and is 0V. The voltage VSL3 is a voltage on the bank selection line SL3 and is 0V, while the voltage VSL4 is a voltage on the bank selection line SL4 and is 0V. When the channel current flows from the embedded N+ diffusion region to the memory cell through the control gate channel, with the write operation not being made in the storage node, the read current flows via bit line to the selection transistor and to the global bit line of the second aluminum wiring layer.

Figure 21:
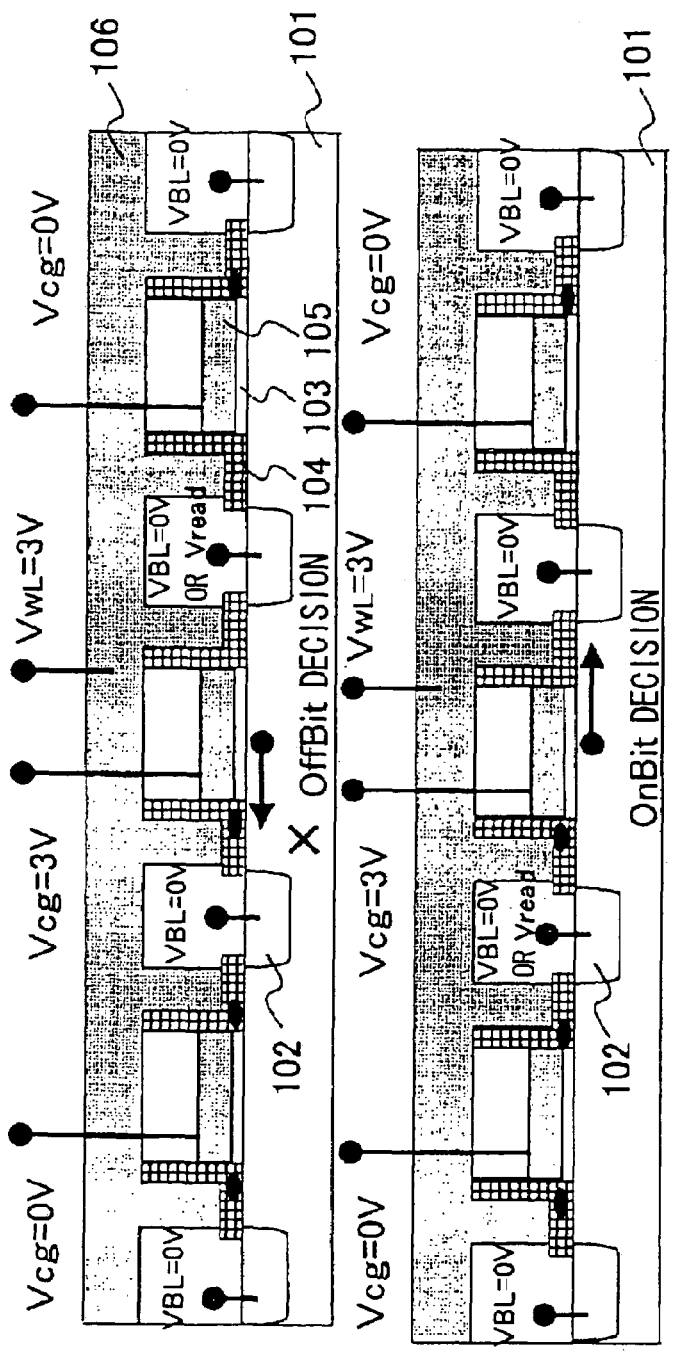
FIG. 21A to 21C show the erase operation in a new file memory in the cross-section taken along line A-A' of FIG. 18, with FIG. 21A illustrating the operation of an L side program, FIG. 21B illustrating the operation of an R side program and FIG. 21C illustrating the operation of L and R side programs.

FIG. 21 illustrates the read operation of the present embodiment, and specifically illustrates the cross-sectional view of FIG. 19 in keeping with the respective states. Referring to FIG. 21, the read operation of the present embodiment is explained. In the present embodiment, read is made with the channel of the control gate operating as a source or a drain. The interference current to the N+ neighboring cell is eliminated, while the pre-charging of the non-selected line is unneeded.

FIG. 21A illustrates the operation of reading the left side cell of the control gate (L bit read) with the control gate channel as a drain. The voltage Vcg=3V is applied to the control gate electrode CG2, the voltage VBL=0 is applied to the source side diffusion region 102 and the voltage VWL=3V is applied to the word line WL2. If the threshold value of the read cell has been programmed to 3V or higher, the channel directly below the storage node is in an off-state, such that no channel current flows (X of FIG. 21A). If the storage node of the selected cell has not been programmed, the channel is turned on.

Referring to FIG. 21B, in an operation of reading the left side cell of the control gate (R bit read), the control gate channel is set to the drain side, such that bias setting of the R bit read is the reverse of the L bit read.

FIG. 21C illustrates the read operation which is carried out as the control gate channel is set to the source side and as the diffusion region of the cell is set to the drain. For L-bit read, the voltage Vcg=3V is applied to the control gate CG2 of the cell being read. The voltage VBL=Vread is applied to the drain side diffusion region and VWL=3V is applied to the word line WL2. If the threshold value of the read cell is programmed to 3V or higher, the channel directly below the storage node is off, such that no channel current from the drain diffusion region 102 flows (VBL=Vread) (see "OFF bit decision" X in FIG. 21C).

Although the present invention has been described with reference to the preferred embodiments, the present invention is not limited to these merely illustrative embodiments and may, of course, comprise various modifications or corrections as may occur to those ordinarily skilled in the art within the scope of the invention as set forth in the appended claims.

The meritorious effects of the present invention are summarized as follows.

According to the present invention, described above, in which source side injection is performed with the control gate channel as a source, programming of the target storage node may be achieved without intermediary of the non-target storage node, so that the programming remains unaffected by the non-target storage node to improve the reliability of the device characteristics.

According to the present invention, the storage node of interest may be read, without intermediary of the storage node which is not of interest, by read with the channel of the control gate as the drain, so that the memory cell operates substantially as a one-bit cell, thus achieving the particularly stable memory cell current.

According to the present invention, hole diffusion may be prohibited by applying the positive potential to the channel of the control gate electrode. Since holes are injected into the electron trapping region, effective erasure may be achieved, while resistance properties may also be improved.

According to the present invention, a self-matched memory cell configuration may be achieved, so that the manufacture process may be facilitated and stable trap base length may be maintained.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
   a semiconductor substrate;
   a first diffusion region and a second diffusion region arranged in parallel on a surface of said semiconductor substrate;
   a first storage node adjacent to said first diffusion region;
   a second storage node adjacent to said second diffusion region;
   a first gate electrode on said first storage node;
   a second gate electrode on said second storage node;
   a first insulating film provided between said first gate electrode and said substrate;
   a second insulating film provided between said second gate electrode and said substrate;
   a third insulating film provided between said first storage node and said second storage node;
   a third gate electrode on said third insulating film;
   an insulating region provided on said third gate electrode; and
   a fourth insulating film provided between said first insulating film and part of said first gate electrode and between said second insulating film and part of said second gate electrode,
   wherein said first and second diffusion regions, said first and second storage nodes, said first and second gate electrodes, said insulating region and said third gate electrode constitute a cell for storing two bits of information;
   wherein said first and second gate electrodes are connected in common on said insulating region to constitute a word line electrode, and
   wherein said first and said second diffusion regions are formed by self-alignment.

2. The semiconductor memory device of claim 1 wherein said first and said second diffusion regions are formed by masking with said word line electrode.

3. The semiconductor memory device of claim 2 wherein said first and said second diffusion regions are formed by masking with said third gate electrode.

4. The semiconductor memory device of claim 1 wherein said first and second insulating film are laminated dielectric films comprising: a silicon oxide film; a silicon nitride film formed on and overlaying said silicon oxide film; and a silicon oxide film formed on and overlaying said silicon nitride film.

5. The semiconductor memory device of claim 1 wherein, said first insulating film and said second insulating film further comprise sidewall sections.

6. The semiconductor memory device of claim 5, wherein said first gate electrode and said second gate electrode have a first leg and a second leg respectively, protruded towards said substrate into abutment against the sidewall sections of said first and second insulating films.

7. The semiconductor memory device of claim 6 wherein said first leg is extended to said first insulating film and said second leg is extended to said second insulating film.

8. The semiconductor memory device of claim 6 wherein said first leg is provided between the sidewall of said first insulating film and said fourth insulating film and wherein said second leg is provided between the sidewall of said second insulating film and said fourth insulating film.

9. A semiconductor memory device comprising:
   a semiconductor substrate;
   a first diffusion region and a second diffusion region provided in separation from each other on a surface of said substrate;
   a first storage node and a second storage node provided in first and second areas on said substrate neighboring said first and second diffusion regions respectively;
   a first gate electrode and a second gate electrode provided on said first and second storage nodes;
   a first insulating film provided on a third area on said substrate neighboring said first and second areas;
   a third gate electrode provided on said first insulating film;
   a third diffusion region provided in a fourth area on said substrate, said fourth area not sandwiched between said first and second storage nodes in said substrate surface located on an extension of said third gate electrode;
   a second insulating film provided on said third gate electrode;
   wherein said first and second diffusion regions, said first and second storage nodes, said first and second gate electrodes, said first insulating film and said third gate electrode constitute a cell for storing two bits of information;
   wherein said first and second gate electrodes are connected in common on said second insulating film to constitute a word line electrode; and
   wherein said third gate electrode extends in a direction perpendicular to said word line electrode.

10. The semiconductor memory device of claim 9 further comprising:
    a memory cell area;
    wherein said fourth area is formed on the outside of said memory cell area.

11. The semiconductor memory device of claim 9, wherein the third diffusion region which is not sandwiched between said first and second storage nodes has the same polarity with said first and second diffusion regions.

* * * * *